(12) United States Patent
Chen et al.

(10) Patent No.: US 11,810,847 B2
(45) Date of Patent: Nov. 7, 2023

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Chin-Liang Chen, Kaohsiung (TW); Kuan-Lin Ho, Hsinchu (TW); Pei-Rong Ni, Hsinchu (TW); Chia-Min Lin, Hsinchu (TW); Yu-Min Liang, Taoyuan (TW); Jiun-Yi Wu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/357,937

(22) Filed: Jun. 24, 2021

(65) Prior Publication Data

US 2022/0415776 A1 Dec. 29, 2022

(51) Int. Cl.
*H01L 23/498* (2006.01)
*H01L 21/48* (2006.01)
*H01L 23/00* (2006.01)

(52) U.S. Cl.
CPC .... *H01L 23/49833* (2013.01); *H01L 21/4853* (2013.01); *H01L 23/49816* (2013.01); *H01L 23/49838* (2013.01); *H01L 24/16* (2013.01); *H01L 24/32* (2013.01); *H01L 24/73* (2013.01); *H01L 24/81* (2013.01); *H01L 2224/16227* (2013.01); *H01L 2224/32225* (2013.01); *H01L 2224/73204* (2013.01); *H01L 2924/37001* (2013.01)

(58) Field of Classification Search
CPC ................. H01L 24/17; H01L 23/5385; H01L 23/49822; H01L 23/49816
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |

(Continued)

*Primary Examiner* — Michele Fan
(74) *Attorney, Agent, or Firm* — JCIPRNET

(57) ABSTRACT

A package structure includes a redistribution structure and a core substrate. The redistribution structure includes a plurality of connection pads. The core substrate is disposed on the redistribution structure and electrically connected to the plurality of connection pads. The core substrate includes a first interconnection layer and a plurality of conductive terminals. The first interconnection layer has a first region, a second region surrounding the first region, and a third region surrounding the second region, and includes a plurality of bonding pads located in the first region, the second region and the third region. The conductive terminals are electrically connecting the plurality of bonding pads to the plurality of connection pads of the redistribution structure, wherein the plurality of conductive terminals located over the first region, the second region and the third region of the first interconnection layer have different heights.

20 Claims, 28 Drawing Sheets

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2008/0001308 A1* | 1/2008 | Chen ................. H01L 23/16 |
| | | 257/E23.101 |
| 2010/0143656 A1* | 6/2010 | Zu .................... H05K 3/3485 |
| | | 228/103 |
| 2015/0001740 A1* | 1/2015 | Shi .................. H01L 25/0657 |
| | | 257/784 |
| 2021/0118785 A1* | 4/2021 | Lin ................. H01L 21/4853 |
| 2021/0217707 A1* | 7/2021 | Tsai ................. H01L 21/568 |

\* cited by examiner

PACKAGE STRUCTURE AND METHOD OF FABRICATING THE SAME

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
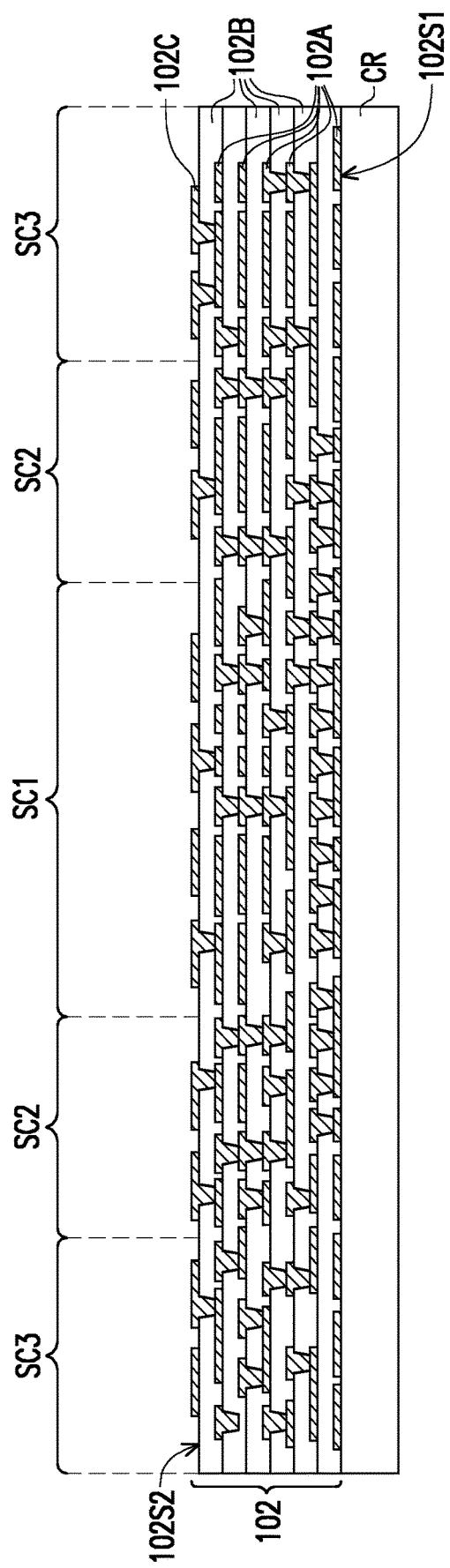
FIG. 1 to FIG. 11 are schematic top and sectional views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In current applications, during the bonding of substrate onto the wafer of system-on-integrated-substrate (SoIS) packages, joint defects such as cold joints or joint bridge may be easily induced due to the warpage behavior difference between the substrate and wafer. For example, it is likely that the substrate may have a smile shape warpage at high temperatures, while the wafer may have a cry shape warpage at high temperatures. In some embodiments described herein, by changing the design of conductive terminals, the solder resist openings of the bonding pads, and the connection pads in between the substrate and wafer, the joint reliability and process yield between the substrate and wafer may be effectively improved.

FIG. 1 to FIG. 11 are schematic top and sectional views of various stages in a method of fabricating a package structure according to some exemplary embodiments of the present disclosure. Referring to FIG. 1, a redistribution structure 102 is formed over a carrier R. In some embodiments, the carrier CR may be a glass carrier or any suitable carrier for carrying a semiconductor wafer or a reconstituted wafer for the manufacturing method of the package structure. A shape of the carrier CR may be circle, rectangle or other suitable shape. In some embodiments, the redistribution structure 102 may be a fan-out redistribution structure, for example. In some embodiments, the redistribution structure 102 is part of a wafer in a system-on-integrated-substrate (SoIS) package. The redistribution structure 102 may include a first surface 102S1 and a second surface 102S2 opposite to the first surface 102S1. For example, the first surface 102S1 of the redistribution structure 102 is attached to the carrier CR.

In some embodiments, the formation of the redistribution structure 102 may include sequentially forming a plurality of conductive patterns 102A and a plurality of dielectric layers 102B alternately stacked over the carrier CR, and forming a plurality of connection pads 102C over the topmost dielectric layer 102B. The connection pads 102C are exposed at the second surface 102S2 and being electrically connected to the conductive patterns 102A. In some embodiments, the conductive patterns 102A and the connection pads 102C are formed by a deposition followed by a photolithography and etching process. In some embodiments, the conductive patterns 102A and the connection pads 102C are formed by an electroplating or an electroless plating. The conductive patterns 102A and the connection pads 102C may include metallic materials, such as aluminum, titanium, copper, nickel, tungsten, and/or alloys thereof, or the like.

In some embodiments, the dielectric layers 102B are formed by suitable fabrication techniques such as spin-on coating, chemical vapor deposition (CVD), plasma-enhanced chemical vapor deposition (PECVD) or the like. In some embodiments, a material of the dielectric layers 102B may include polymers such as polyimide, polybenzoxazole (PBO) or benzocyclobutene (BCB), a nitride such as silicon nitride, oxide such as silicon oxide, phosphosilicate glass (PSG), borosilicate glass (BSG), boron-doped phosphosilicate glass (BPSG), a combination thereof or the like, which may be patterned using a photolithography and/or etching process.

As illustrated in FIG. 1, the redistribution structure 102 may include a first section SC1, a second section SC2 and a third section SC2. For example, the second section SC2 is surrounding or encircling the first section SC1, while the third section SC3 is surrounding or encircling the second section SC2. In some embodiments, the first section SC1, the second section SC2 and the third section SC2 may correspond to a position of a first region, a second region and a third region of a core substrate (not shown) formed in subsequent steps. In some embodiments, the connection pads 102C located in the first section SC1, the second section SC2 and the third section SC3 have substantially equal widths.

Figure 2:
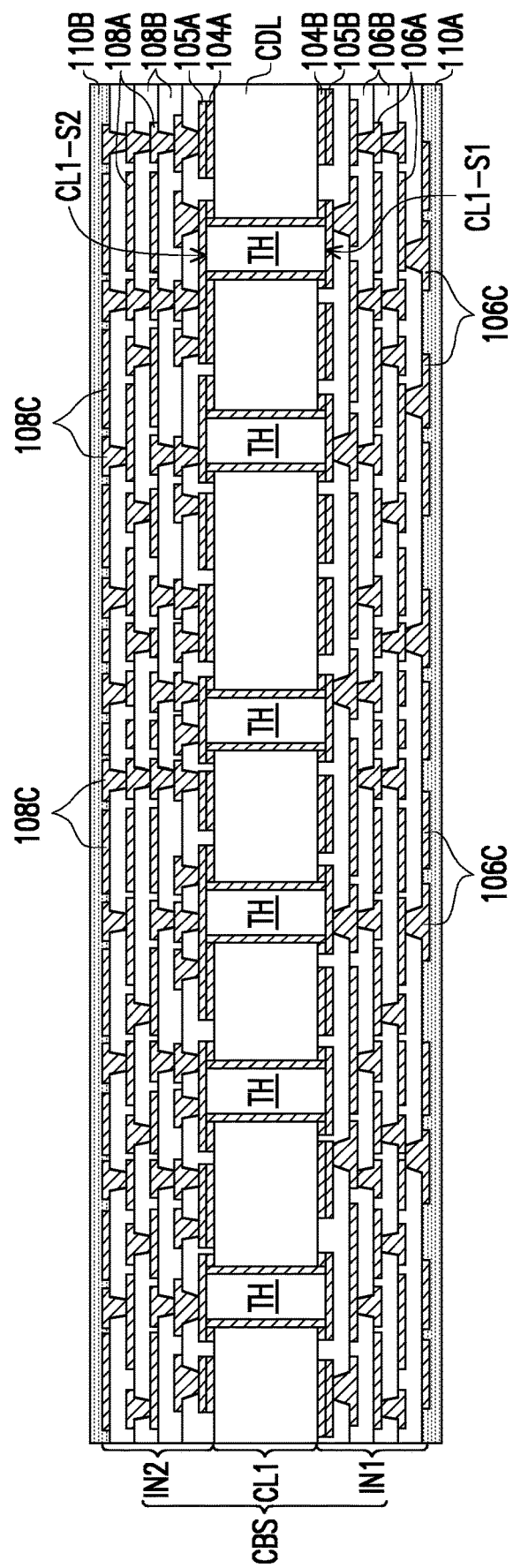

Referring to FIG. 2, a core substrate CBS is provided. In some embodiments, the core substrate CBS includes a core layer CL1, a first interconnection layer IN1 and a second interconnection layer IN2. The first interconnection layer IN1 and the second interconnection layer IN2 are disposed on two opposing surfaces of the core layer CL1. In some embodiments, the core layer CL1 includes a core dielectric layer CDL, core conductive layers 104A and 104B, conductive lids 105A and 105B, and plated through holes TH. In some embodiments, the core dielectric layer CDL includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer CDL may be formed by a lamination process, a coating process, or the like. The core conductive layers 104A and 104B are formed on the opposite sides of the core dielectric layer CDL. In some embodiments, the core conductive layers 104A and 104B include copper, gold, tungsten, aluminum, silver, gold, a combination thereof, or the like. The conductive lids 105A and 105B are located respectively over the core conductive layers 104A and 104B. In some embodiments, the conductive lids 105A and 105B include copper or other suitable conductive material, for example.

In some embodiments, the plated through holes TH are disposed in and penetrate through the core dielectric layer CDL, which provide electrical connection between the core conductive layer 104A and the core conductive layer 104B. In other words, the plated through holes TH provide electrical paths between the electrical circuits located on two opposing sides of the core dielectric material layer CDL. In some embodiments, the plated through holes TH may be formed by first forming through holes (not shown) at predetermined positions by, for example, mechanical or laser drilling, etching, or other suitable removal techniques. A desmear treatment may be performed to remove residues remaining in the through holes. Subsequently, the through holes may be plated with conductive materials (e.g., plating copper through electroless plating/electrochemical plating) to a predetermined thickness, thereby providing the plated through holes TH. Thereafter, the plated through holes TH may be filled with insulating materials or conductive materials. In some embodiments, the insulating material includes solder mask material, via plugging material, epoxy, or the like. In certain embodiments, the conductive materials filled in the plated through holes TH may be the same as the material used for plated through holes.

In some embodiments, the core conductive layers 104A and 104B, the conductive lids 105A and 105B, and the plated through holes TH may be formed by the following steps. For example, a first conductive material (not shown) is respectively formed on two opposite surfaces of the core dielectric layer CDL. Then, the plated through holes TH are formed to penetrate the core dielectric layer CDL as mentioned before to provide electrical connection between the first conductive material respectively formed on both surfaces of the core dielectric layer 102. Thereafter, a second conductive material is respectively formed over the first conductive materials on the opposite surfaces of the core dielectric layer CDL, where the second conductive material may be different from the first conductive material. In some embodiments, the first and second conductive materials may be formed by using any suitable method (e.g., chemical vapor deposition (CVD) sputtering, printing, plating, or the like). Subsequently, the first conductive material and the second conductive material may be patterned together to form the core conductive layers 104A and 104B and the conductive lids 105A and 105B respectively. In some embodiments, the first and second conductive materials may be partially removed using a photolithography and etching process or another suitable removal technique.

In some embodiments, the first interconnection layer IN1 and the second interconnection layer IN2 are respectively formed on two opposing sides of the core layer CL1. For example, the first interconnection layer IN1 is formed over the first surface CL1-S1 of the core layer CL1, and the second interconnection layer IN2 is formed over the second surface CL1-S2 of the core layer CL1. In the exemplary embodiment, the formation of the first interconnection layer IN1 may include sequentially forming a plurality of first conductive patterns 106A and a plurality of first dielectric layers 106B alternately stacked over the first surface CL1-S1 of the core layer CL1, and forming a plurality of bonding pads 106C over the topmost dielectric layer 106B. Similarly, the formation of the second interconnection layer IN2 may include sequentially forming a plurality of second conductive patterns 108A and a plurality of second dielectric layers 108B alternately stacked over the second surface CL1-S2 of the core layer CL1, and forming a plurality of bonding pads 108C over the topmost dielectric layer 108B.

Although only three layers of conductive patterns and four layers of dielectric layers are illustrated for each of the first interconnection layer IN1 and the second interconnection layer IN2, the scope of the disclosure is not limited thereto. In other embodiments, the number of the conductive patterns (106A/108A) and the number of dielectric layers (106B/108B) may be adjusted based on design requirement. In some exemplary embodiments, the total number of layers of the first interconnection layer IN1 and the second interconnection layer IN2 sums up to a total of 28 to 36 layers for the conductive patterns and dielectric layers. In other words, there may be 28 to 36 layers of the conductive patterns (106A/108A), and 28 to 36 layers of the dielectric layers (106B/108B). In certain embodiments, the number of layers in the first interconnection layer IN1 is equal to the number of layers in the second interconnection layer IN2.

In the illustrated embodiment, the first interconnection layer IN1 and the second interconnection layer IN2 are electrically connected to the plated through holes TH. For example, the bonding pads 106C, 108C, the first conductive patterns 106A and the second conductive patterns 108A may be electrically connected to the plated through holes TH through the core conductive layers 104A and 104B and the conductive lids 105A and 105B.

In the exemplary embodiment, a material of the dielectric layers (106B/108B) may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers (106B/108B) are formed by suitable fabrication techniques such as spin-on coating, chemical vapor deposition (CVD), plasma-enhanced chemical vapor deposition (PECVD) or the like. The disclosure is not limited thereto.

In some embodiments, a material of the bonding pads (106C/108C) and the conductive patterns (106A/108A) may include conductive materials formed by electroplating or deposition, such as aluminum, titanium, copper, nickel, tungsten, and/or alloys thereof, which may be patterned using a photolithography and etching process. In some embodiments, the bonding pads (106C/108C) and the conductive patterns (106A/108A) may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

As further illustrated in FIG. 2, in some embodiments, solder mask layers 110A and 110B are formed over the outermost dielectric layers (106B/108B) of the first interconnection layer IN1 and the second interconnection layer IN2 to cover the bonding pads (106C/108C). In some embodiments, the solder mask layers 110A and 110B are made of polymeric materials, or other suitable insulating materials. In some embodiments, the solder mask layers 110A and 110B may be formed of materials having a chemical composition of silica, barium sulfate and epoxy resin, and/or the like. For example, the material of the solder mask layers 110A and 110B may be selected to withstand the temperatures of molten conductive materials (e.g., solders, metals, and/or metal alloys) to be subsequently disposed within the openings of the solder mask layers 110A and 110B.

Figure 3A:
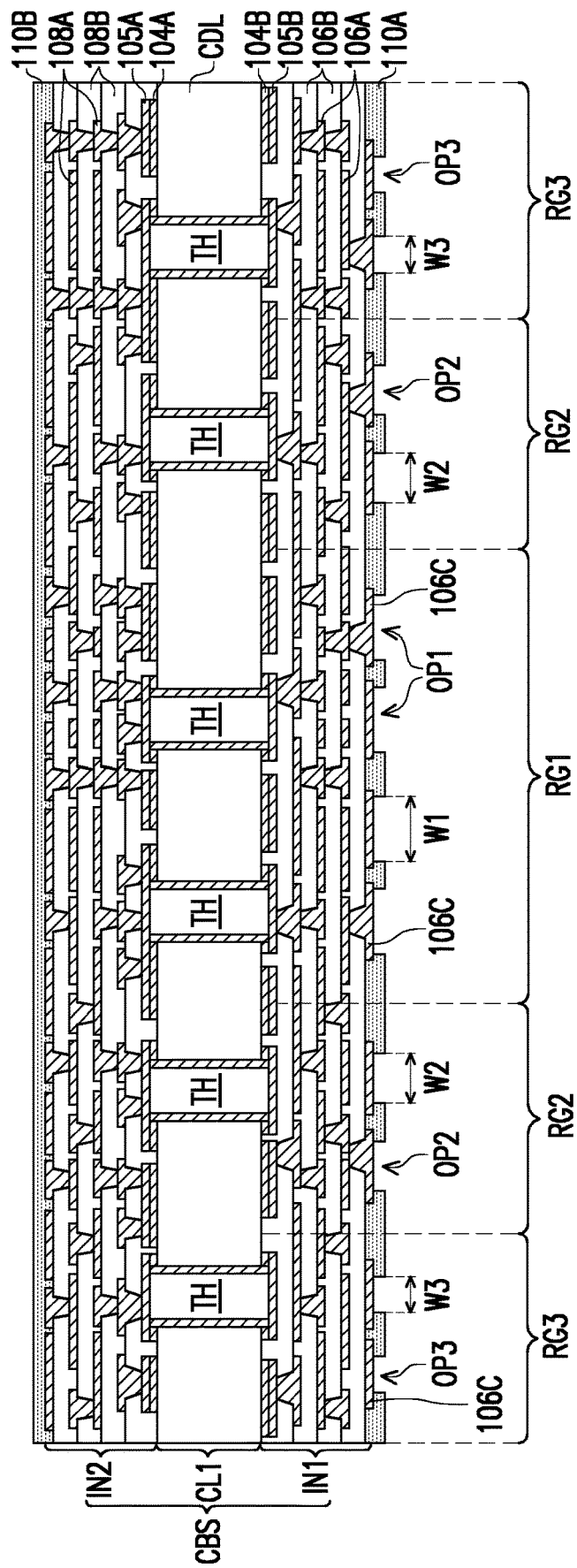
Figure 3B:
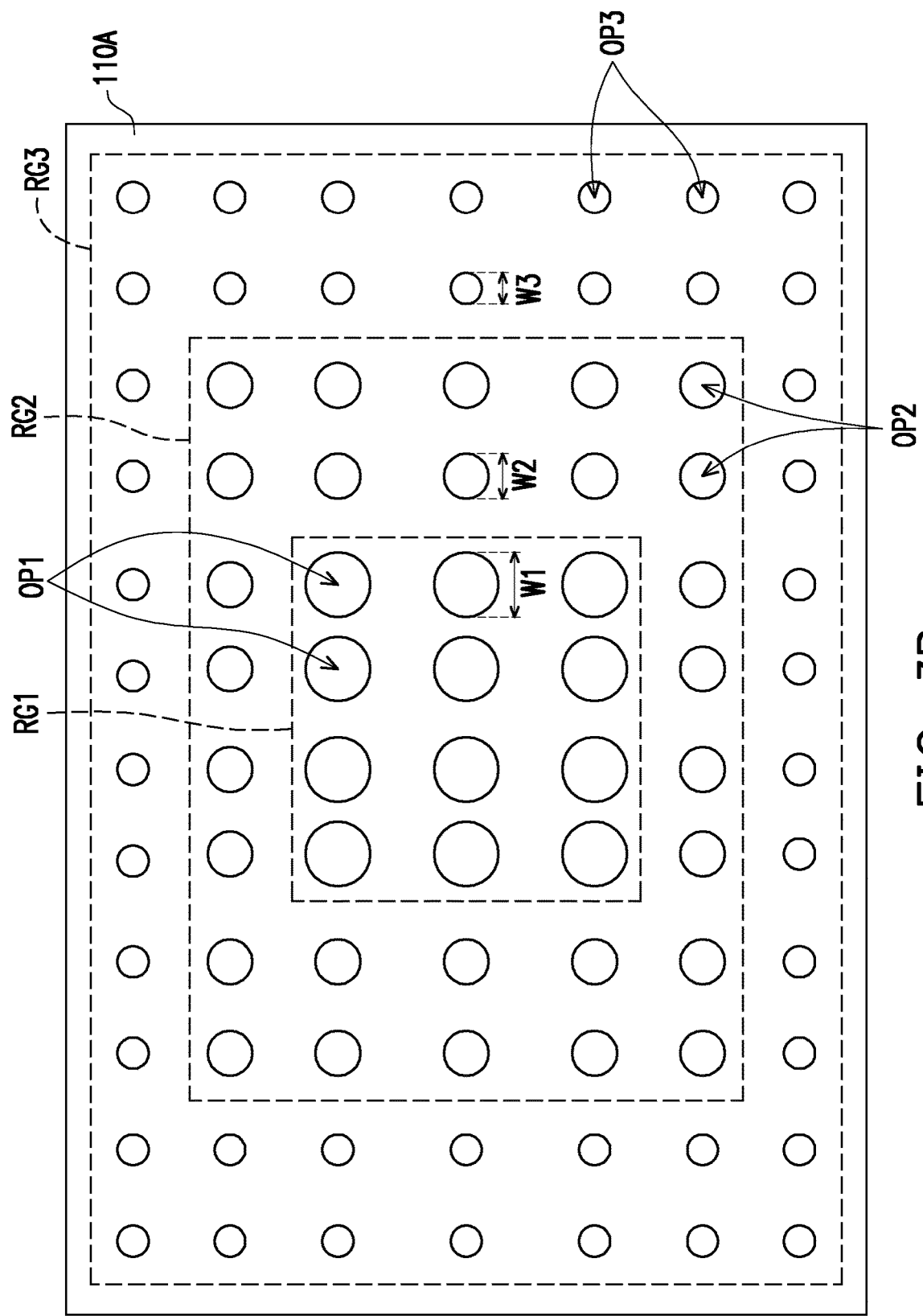

Referring to FIG. 3A, in a subsequent step, the solder mask layer 110A of the first interconnection layer IN1 is patterned to form a plurality of openings (OP1, OP2 and OP3) revealing the bonding pads 106C. For example, referring to FIG. 3B, which is a top view of the first interconnection layer IN1 shown in FIG. 3A, the first interconnection layer IN1 may include a first region RG1, a second region RG2 surrounding or encircling the first region RG1, and a third region RG3 surrounding or encircling the second region RG2. In some embodiments, the solder mask layer 110A is patterned to from a plurality of first openings OP1 in the first region RG1, a plurality of second openings OP2 in the second region RG2, and a plurality of third openings OP3 in the third region RG3. For example, as illustrated in FIG. 3A and FIG. 3B, the first openings OP1 has a first width W1, and the first openings OP1 are revealing the bonding pads 106C in the first region RG1. The second openings OP2 has a second width W2, and the second openings OP2 are revealing the bonding pads 106C in the second region RG2. The third openings OP3 has a third width W3, and the third openings OP3 are revealing the bonding pads 106C in the third region RG3. In the exemplary embodiment, the first width W 1, the second width W2 and the third width W3 fulfills the following relationship: W1>W2>W3. In other words, the first openings OP1 has the greatest width, while the third opening OP3 has the smallest width. In certain embodiments, the width of the openings (OP1, OP2, OP3) of the solder mask layer 110A increases from the boundary region (e.g. third region RG3) to the central region (e.g. first region RG1) of the first interconnection layer IN1.

Figure 4:
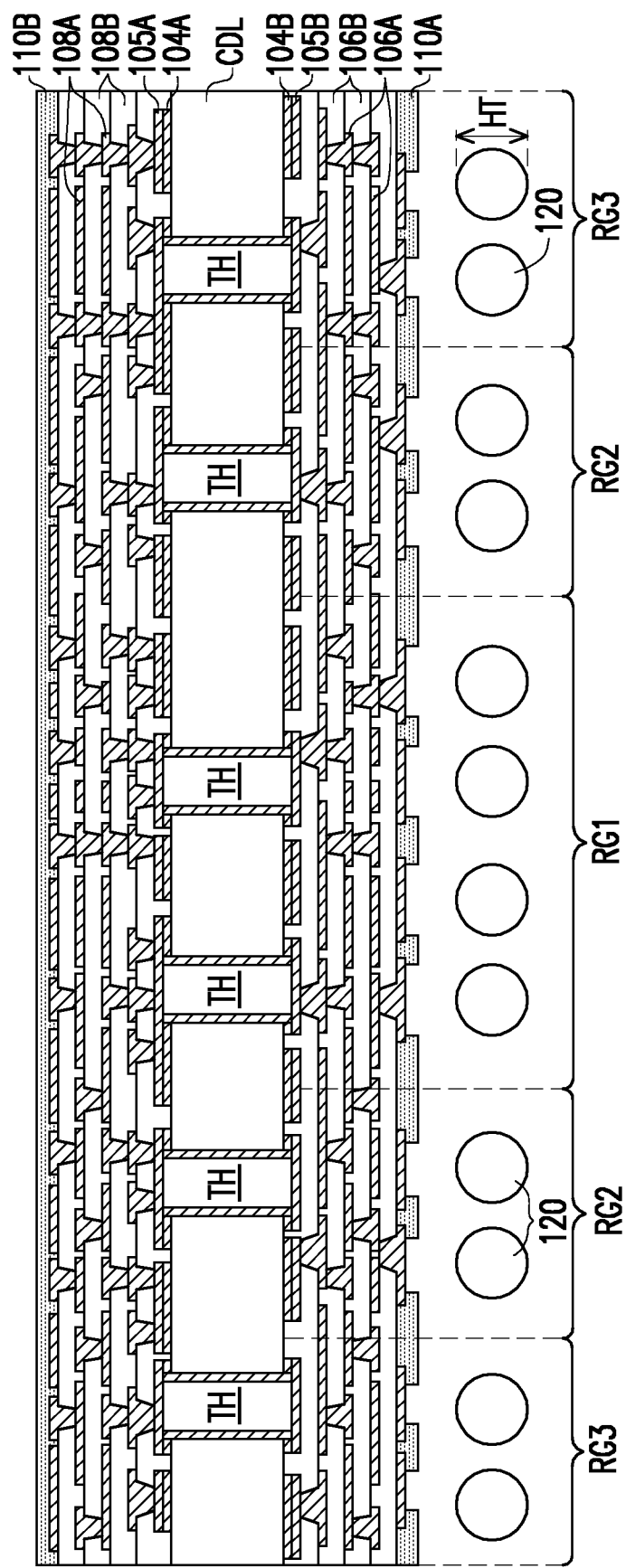

Referring to FIG. 4, after forming the openings (OP1, OP2, OP3) in the solder mask layer 110A, a plurality of conductive terminals 120 are disposed over the openings (OP1, OP2, OP3) in the first region RG1, the second region RG2 and the third region RG3. For example, the conductive terminals 120 are solder bumps or solder balls. Prior to joining the conductive terminals 120 to the bonding pads 106C of the first interconnection layer IN1 revealed by the openings (OP1, OP2, OP3), the conductive terminals 120 located over the first region RG1, the second region RG2 and the third region RG3 may have substantially the same height HT. In certain embodiments, the conductive terminals 120 located over the first region RG1, the second region RG2 and the third region RG3 have substantially the same volume or size (e.g. using the same amount of materials to form the conductive terminals 120).

Figure 5:
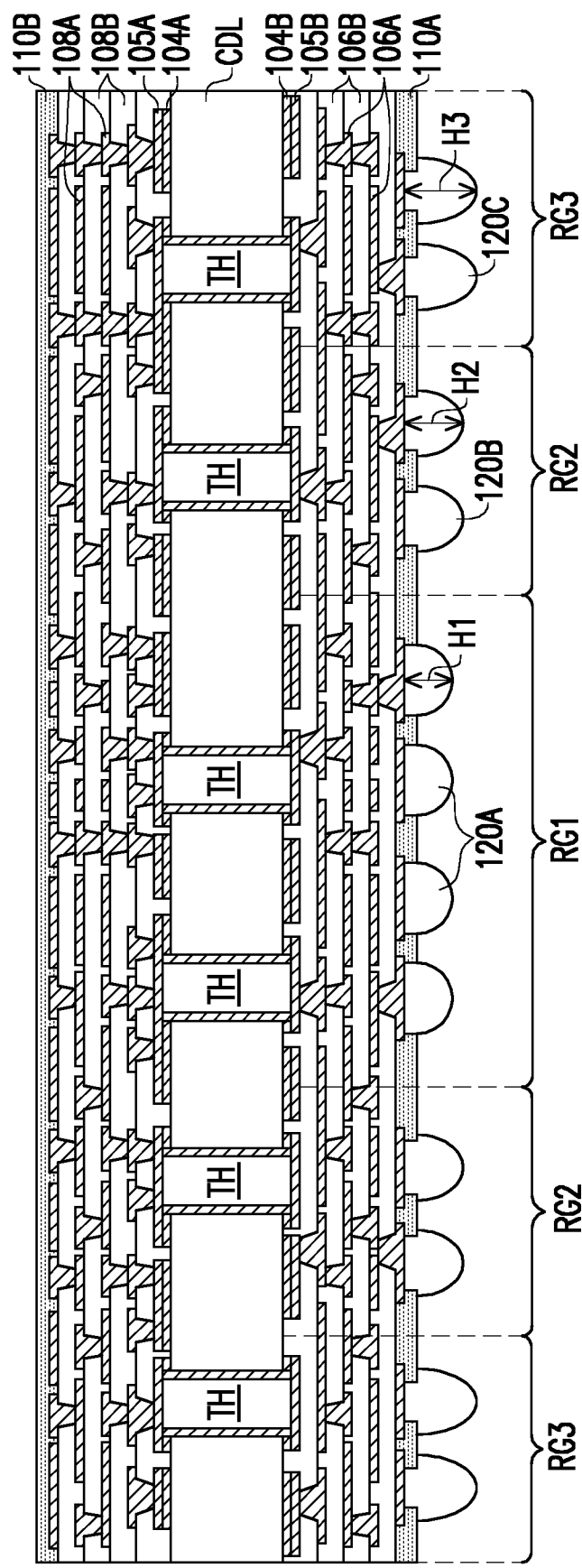

Referring to FIG. 5, in a subsequent step, the conductive terminals 120 are attached onto the bonding pads 106C through a reflow process. In some embodiments, the height HT of the conductive terminals 120 will be reduced after the reflow process. For example, due to partial melting (or solder collapse/deformation) of the conductive terminals 120, and the spreading of the materials in the openings (OP1, OP2, OP3) with different widths (W1, W2, W3), conductive terminals (120A, 120B, 120C) having different heights may be formed. For example, first conductive terminals 120A are formed in the first openings OP1 over the bonding pads 106C in the first region RG1, and have a first height H1. Second conductive terminals 120B are formed in the second openings OP2 over the bonding pads 106C in the second region RG2, and have a second height H2. Third conductive terminals 120C are formed in the third opening OP3 over the bonding pads 106C in the third region RG3, and a have a third height H3, wherein H3>H2>H1. In other words, a height of the conductive terminals (120A, 120B, 120C) may decrease from a boundary region (e.g. third region RG3) of the first interconnection layer IN1 to a central region (e.g. the first region RG1) of the first interconnection layer IN1.

In some embodiments, first conductive terminals 120A reflowed onto the bonding pads 106C in the first region RG1 have the smallest height (H1) due to more solder spreading and a greater opening area (opening width W1) for pad attachment. In some embodiments, second conductive terminals 120B reflowed onto the bonding pads 106C in the second region RG2 have a medium height (H2) due to medium solder spreading and a medium opening area (opening width W2) for pad attachment. In certain embodiments, third conductive terminals 120C reflowed onto the bonding pads 106C in the third region RG3 have the greatest height (H3) due to less solder spreading and a smaller opening area (opening width W3) for pad attachment.

Figure 6A:
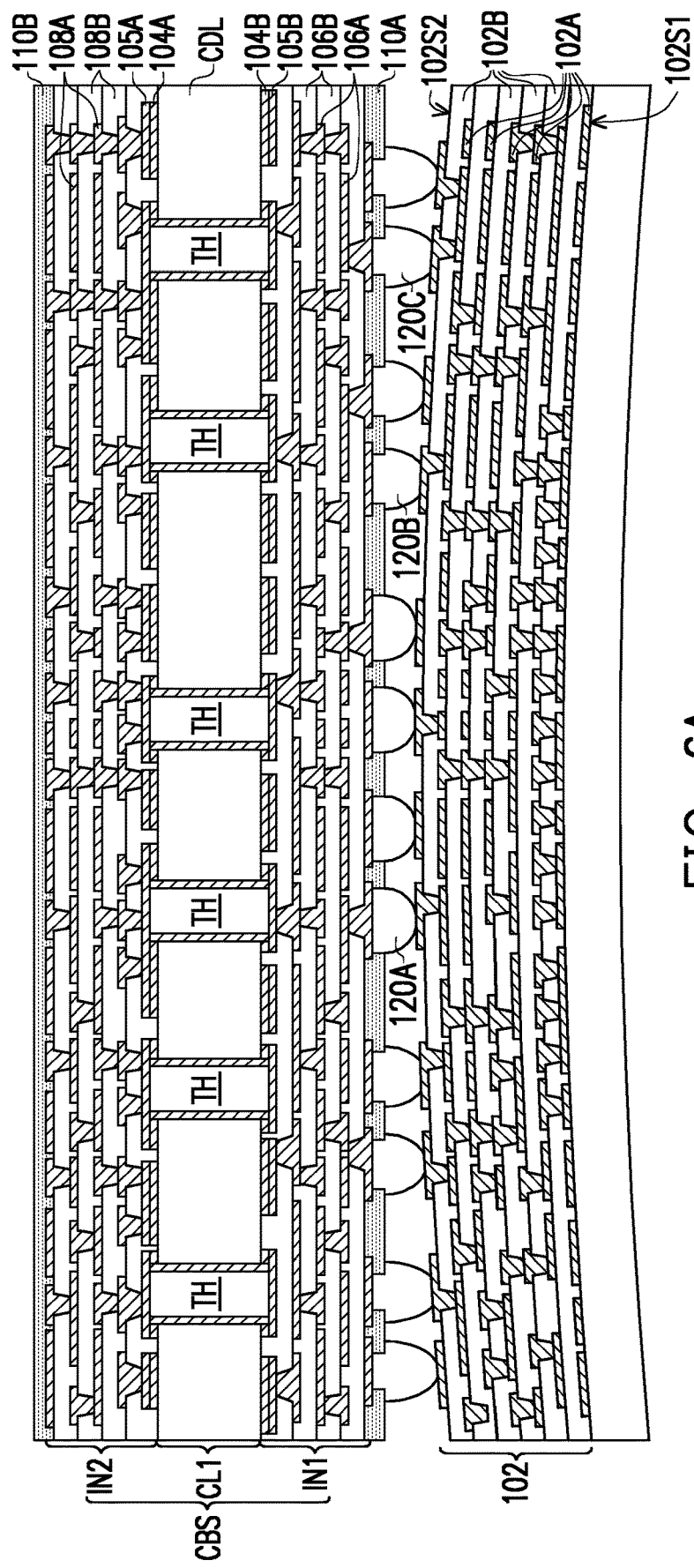

Referring to FIG. 6A, after forming the conductive terminals (120A, 120B, 120C), the core substrate CBS illustrated in FIG. 5 is attached or bonded onto the redistribution structure 102 illustrated in FIG. 1. For example, the core substrate CBS is bonded and attached to the redistribution structure 102 through a reflow process. In some embodiments, although only one core substrate CBS is illustrated herein, it is noted that a plurality of core substrate CBS may be bonded onto the redistribution structure 102 (the wafer) respectively. In other words, the number of core substrate CBS bonded onto the redistribution structure 102 may be appropriately adjusted, and may be altered depending on the wafer size.

After bonding the core substrate CBS to the redistribution structure 102, the conductive terminals (120A, 120B, 120C) are physically and electrically attached to the connection pads 102C of the redistribution structure 102. For example, the first conductive terminals 120A in the first region RG1 are attached to the connection pads 102C located in the first section SC1 of the redistribution structure 102. The second conductive terminals 120B in the second region RG2 are attached to the connection pads 102C located in the second section SC2 of the redistribution structure 102. The third conductive terminals 120C in the third region RG3 are attached to the connection pads 102C located in the third section SC2 of the redistribution structure 102. In the illustrated embodiment, the redistribution structure 102 has a cry warpage. Since the core substrate CBS bonded onto the redistribution structure 102 include conductive terminals (120A, 120B, 120C) with different heights, the warpage problem of the redistribution structure 102 may be compensated, and the joint reliability and process yield between the substrate (core substrate CBS) and the wafer (redistribution structure 102) may be effectively improved.

Figure 6B:
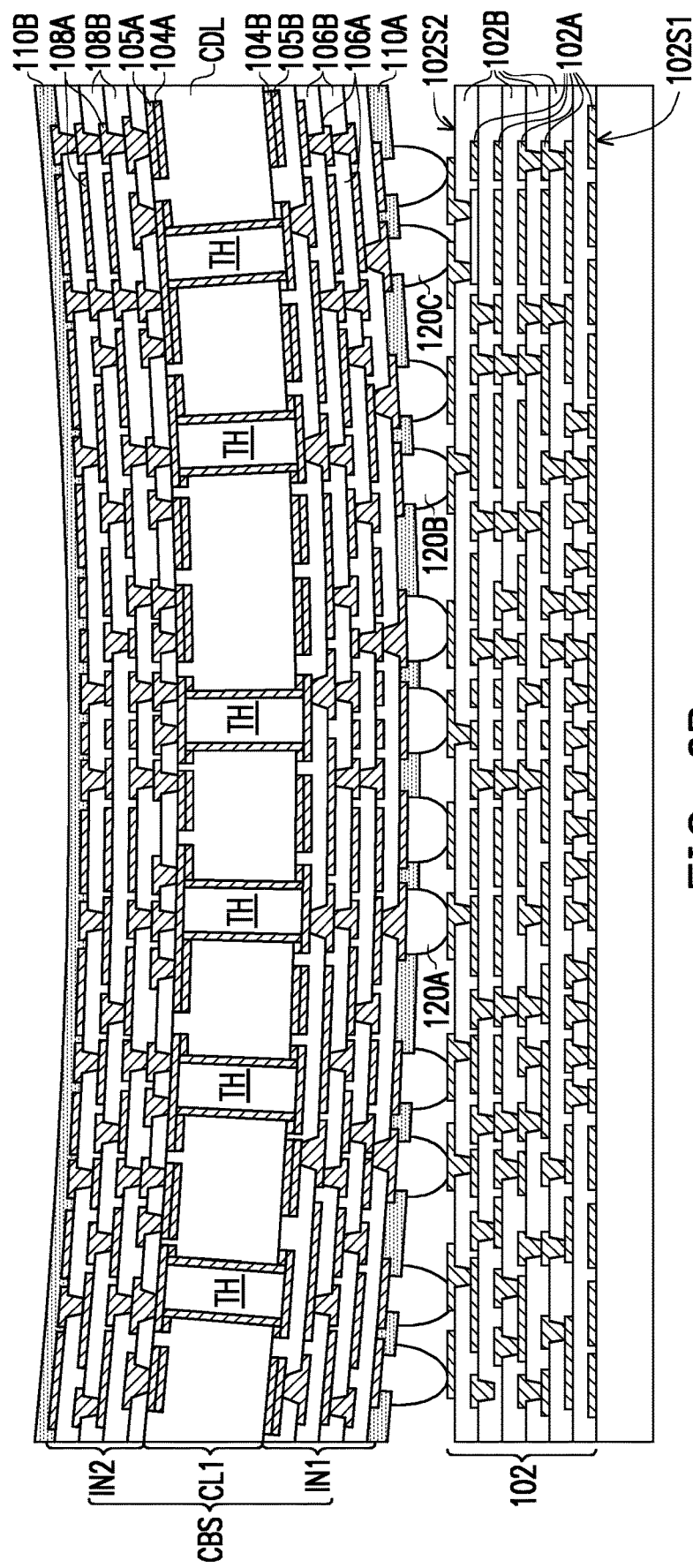

FIG. 6B is an alternative embodiment of bonding the core substrate CBS to the redistribution structure 102. In the embodiment illustrated in FIG. 6A, the redistribution structure 102 is shown to have a cry shape warpage. However, the disclosure is not limited thereto. For example, as shown in FIG. 6B, in some alternative embodiments, the core substrate CBS has a smile shape warpage during bonding. In the embodiment of FIG. 6B, since the core substrate CBS bonded onto the redistribution structure 102 include conductive terminals (120A, 120B, 120C) with different heights, the warpage problem of the core substrate CBS may be compensated, and the joint reliability and process yield between the substrate (core substrate CBS) and the wafer (redistribution structure 102) may be effectively improved. In some other embodiments, when the core substrate CBS has the smile warpage and the redistribution structure 102 has the cry warpage, the warpage problem of both the core substrate CBS and the redistribution structure 102 may also be compensated due to the presence of the conductive terminals (120A, 120B, 120C) with different heights.

Figure 7:
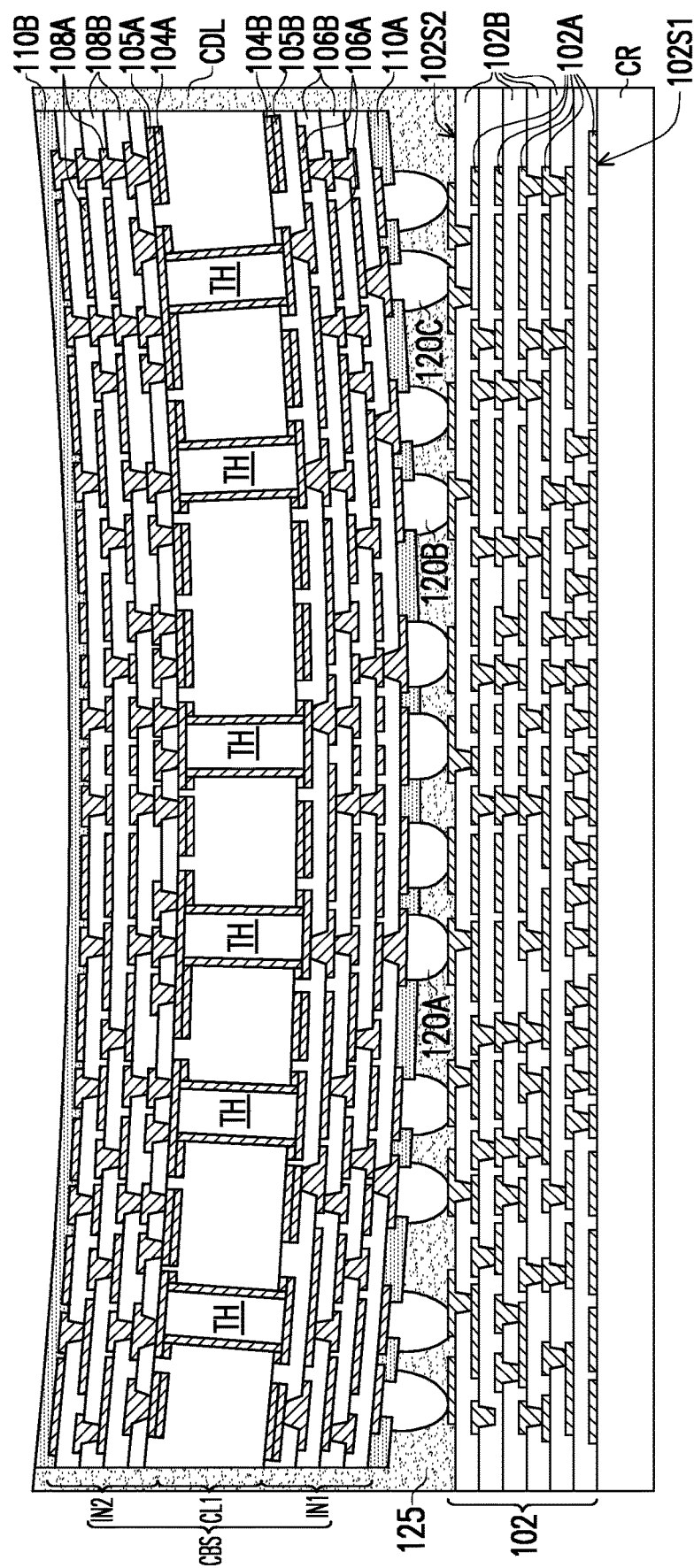

Referring to FIG. 7, after bonding the core substrate CBS to the redistribution structure 102, an insulating encapsulant 125 is formed on the redistribution structure 102 to encapsulate the core substrate CBS. In some embodiments, the insulating encapsulant 125 may be a molding compound, molded underfill, polymer such as polyimide, polybenzoxazole (PBO) or benzocyclobutene (BCB), Ajinomoto Buildup Film (ABF) or other suitable encapsulating materials, for example. In some embodiments, the insulating encapsulant 125 may be formed by a molding process or other suitable methods. In the exemplary embodiment, the insulating encapsulant 125 is formed by an over-molding process, and a planarization step to remove excess encapsulating materials. In some embodiments, the insulating encapsulant 125 covers and surround the sidewalls of the core substrate CBS. In certain embodiments, sidewalls of the insulating encapsulant 125 are aligned with sidewalls of the redistribution structure 102. In addition, the insulating encapsulant 125 fills in the space between the core substrate CBS and the redistribution structure 102 to encapsulate the first conductive terminals 120A, the second conductive terminals 120B and the third conductive terminals 120C. In some embodiments, when a plurality of core substrates CBS is bonded onto the redistribution structure 102, then the insulating encapsulant 125 is formed to encapsulate all the plurality of core substrates CBS.

Figure 8:
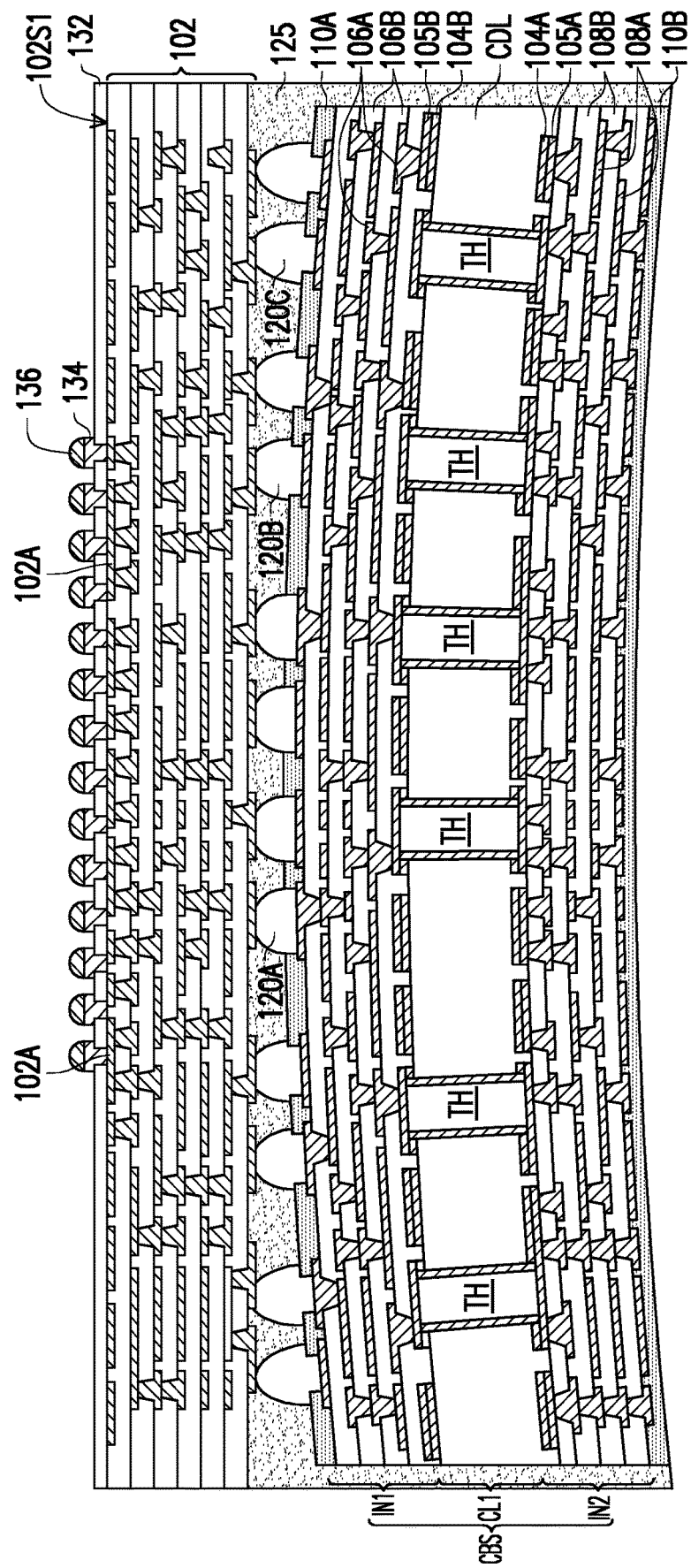

Referring to FIG. 8, in a subsequent step, the redistribution structure 102 along with the core substrate CBS is de-bonded from the carrier CR, and is turned upside down. In other words, the carrier CR is removed to reveal the first surface 102S1 of the redistribution structure 102. In some embodiments, a plurality of electrical connectors 136 are formed over the redistribution structure 102. For example, before forming the electrical connectors 136, a dielectric layer 132 is formed on the redistribution structure 102, and a plurality of conductive patterns 134 are formed in the dielectric layer 132 to electrically connect the redistribution structure 102. In some embodiments, the dielectric layer 132 is formed on and exposes the outermost conductive pattern 102A of the redistribution structure 102.

In some embodiments, a material of the dielectric layer 132 may be a polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), a combination thereof or the like. In some embodiments, the dielectric layer 132 may be formed by suitable fabrication techniques such as spin-on coating, chemical vapor deposition (CVD), plasma-enhanced chemical vapor deposition (PECVD) or the like. In some embodiments, the material of the dielectric layer 132 may be different from the material of the outermost dielectric layer 102B of the redistribution structure 102, for example. In some embodiments, the conductive patterns 134 are used as conductive terminals, which may include a plurality of conductive pillars and a plurality of under-ball metallurgy (UBM) patterns underneath for ball mount.

After forming the conductive patterns 134 in the dielectric layer 132, the electrical connectors 136 are formed on and electrically connected to the conductive patterns 134. In some embodiments, the electrical connectors 136 may be solder regions such as micro-bumps or the like. The electrical connectors 136 are electrically connected to the redistribution structure 102 through the conductive patterns 134. In some embodiments, the electrical connectors 136 may be formed by a mounting process and a reflow process, for example. In some embodiments, a diameter of the electrical connectors 136 is smaller than a diameter of the conductive terminals (120A, 120B, 120C). For example, in some embodiments, the pitch between the electrical connectors 136 may be 120 μm to 150 μm, and the diameter of the electrical connectors 136 may be between 60 μm to 80 μm. Furthermore, in some embodiments, the pitch between the conductive terminals (120A, 120B, 120C) may be 450 μm to 550 μm, and the diameter of the conductive terminals (120A, 120B, 120C) may be between 200 μm to 300 μm, for example.

Figure 9:
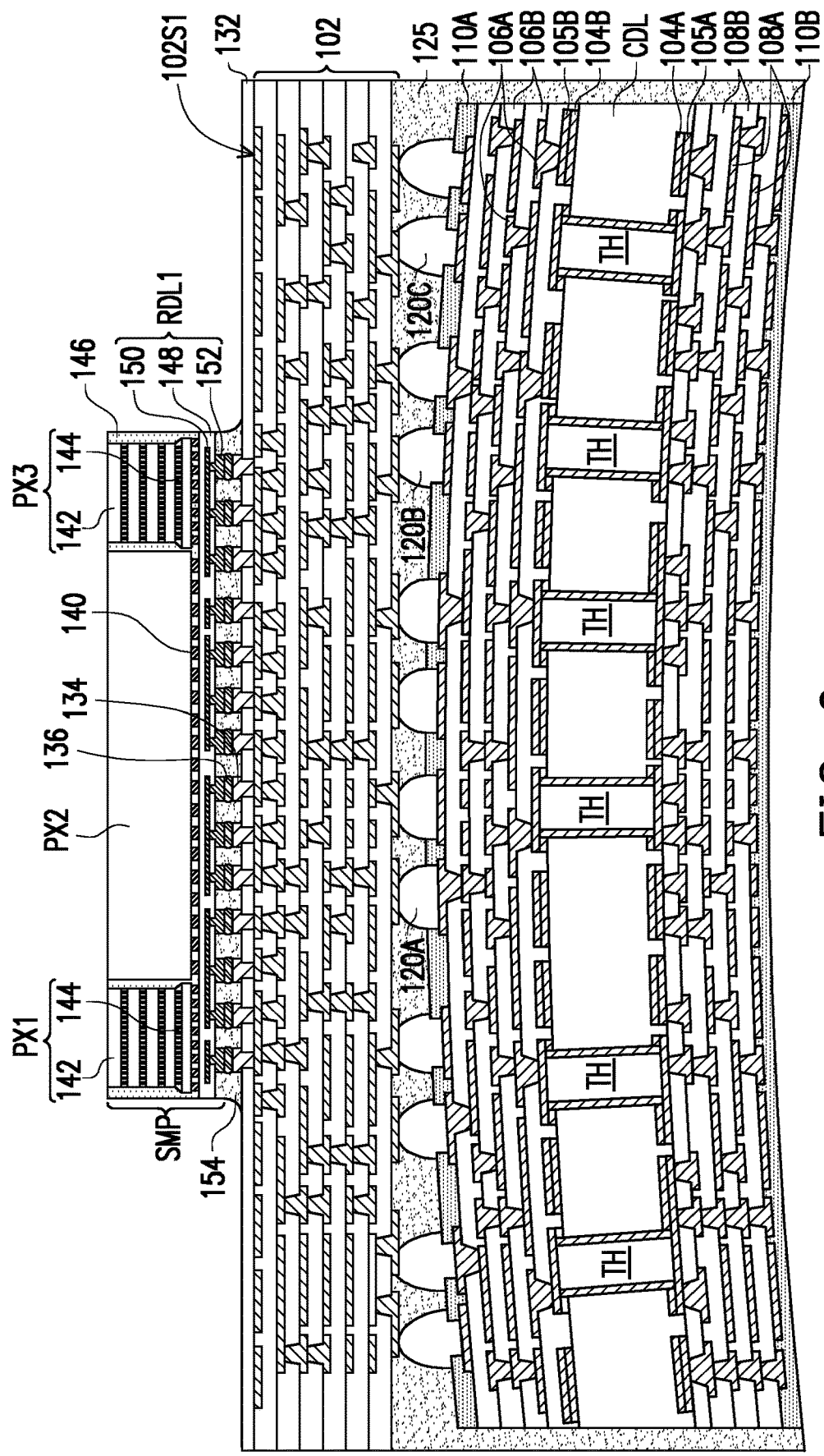

Referring to FIG. 9, a semiconductor package SMP is disposed on the first surface 102S1 of the redistribution structure 102 and over the dielectric layer 132. For example, the semiconductor package SMP is electrically connected to the redistribution structure 102 through the electrical connectors 136 and the conductive patterns 134. In some embodiments, the semiconductor package SMP may include System-On-Chip (SoC) packages, Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. In some embodiments, the semiconductor package SMP includes a plurality of package components PX1, PX2, PX3 with a plurality of connectors 140 located thereon, an encapsulant 146 encapsulating the package components PX1, PX2, PX3, and a redistribution layer RDL1 over the encapsulant 146.

In some embodiments, each of the package components PX1, PX2, PX3 may be a package, a device die, a die stack, and/or the like. The device die may be a high-performance integrated circuit, such as a System-on-Chip (SoC) die, a Central Processing Unit (CPU) die, a Graphic Processing Unit (GPU) die, field-programmable gate array (FPGA) die, a mobile application die, a memory die, or a die stack. In some embodiments, the memory die may be in the form of memory cube such as High Bandwidth Memory (HBM) cube. The package components PX1, PX2, PX3 may have the respective semiconductor substrates (not shown) in the respective dies. In some embodiments, a rear surface of the semiconductor substrates is a surface that faces upward in accordance to the orientation illustrated in FIG. 9. The package components PX1, PX2, PX3 further include integrated circuit devices (such as active devices, which include transistors, for example, not shown) at a front surface (e.g., a surface facing downward) of the respective semiconductor substrates. In some embodiments, the package components PX1, PX2, PX3 have the same or different sizes and/or functions upon the design requirements. In one exemplary embodiment, the package components PX1, PX3 are memory cubes, and the package component PX2 is CPU, GPU, FPGA or other suitable high-performance integrated circuit. In some embodiments, the package components PX1, PX3 may include a die stack 142, and a controller 144 at the bottom of the die stack 142.

In some embodiments, the connectors 140 of the package components PX1, PX2, PX3 are encapsulated in the encapsulant 146 shown in FIG. 9. In some alternative embodiments, the connectors 140 may be disposed in a dielectric layer (not shown) which is then encapsulated by the encapsulant 146. In some embodiments, the redistribution layer RDL1 is disposed over the package components PX1, PX2, PX3 and the encapsulant 146 and electrically connected to the package components PX1, PX2, PX3. In some embodiments, the redistribution layer RDL1 may be a fan-out redistribution layer structure, for example. The redistribution layer RDL1 may include a plurality of dielectric layers 148 and a plurality of conductive patterns 150, 152, and the dielectric layers 148 and the conductive patterns 150, 152 are alternately stacked over the package components PX1, PX2, PX3. In some embodiments, the outermost conductive patterns 152 are used as conductive terminals, which may include a plurality of conductive pillars and a plurality of under-ball metallurgy (UBM) patterns underneath for ball mount.

In some embodiments, after bonding the semiconductor package SMP onto the redistribution structure 102 (the wafer), an underfill structure 154 may be dispensed to protect the electrical connectors 136 in between the semiconductor package SMP and the redistribution structure 102. In some embodiments, the semiconductor package SMP is pre-fabricated, that is, the package components PX1, PX2, PX3 are encapsulated by the encapsulant 146 before bonding to the redistribution structure 102 (the wafer). However, the disclosure is not limited thereto. In some alternative embodiments, the package components PX1, PX2, PX3 may be bonded to the redistribution structure 102 (the wafer), and then the encapsulant 146 is formed over the redistribution structure 102 to encapsulate the package components PX1, PX2, PX3, for example.

Figure 10:
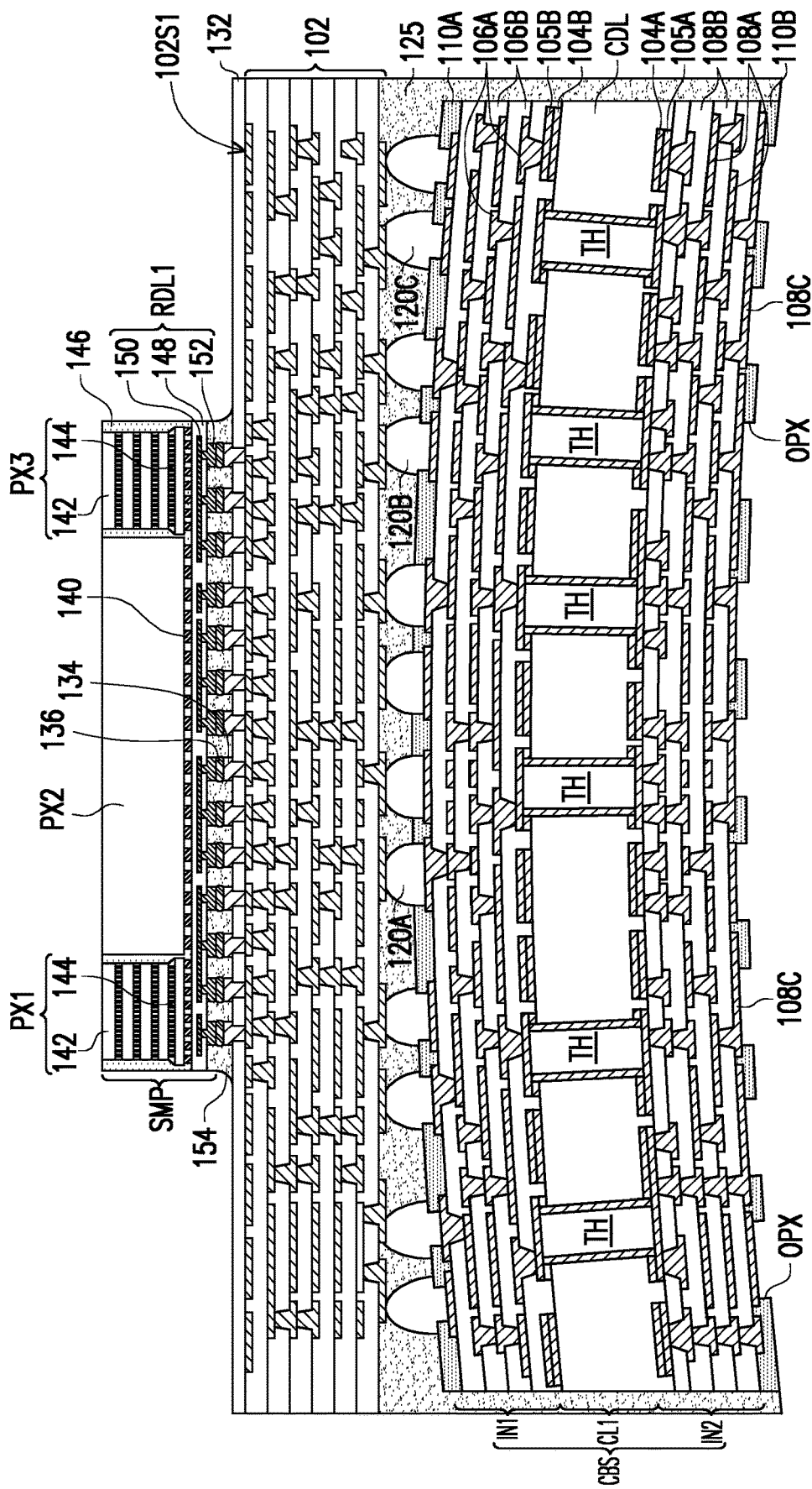
Figure 11:
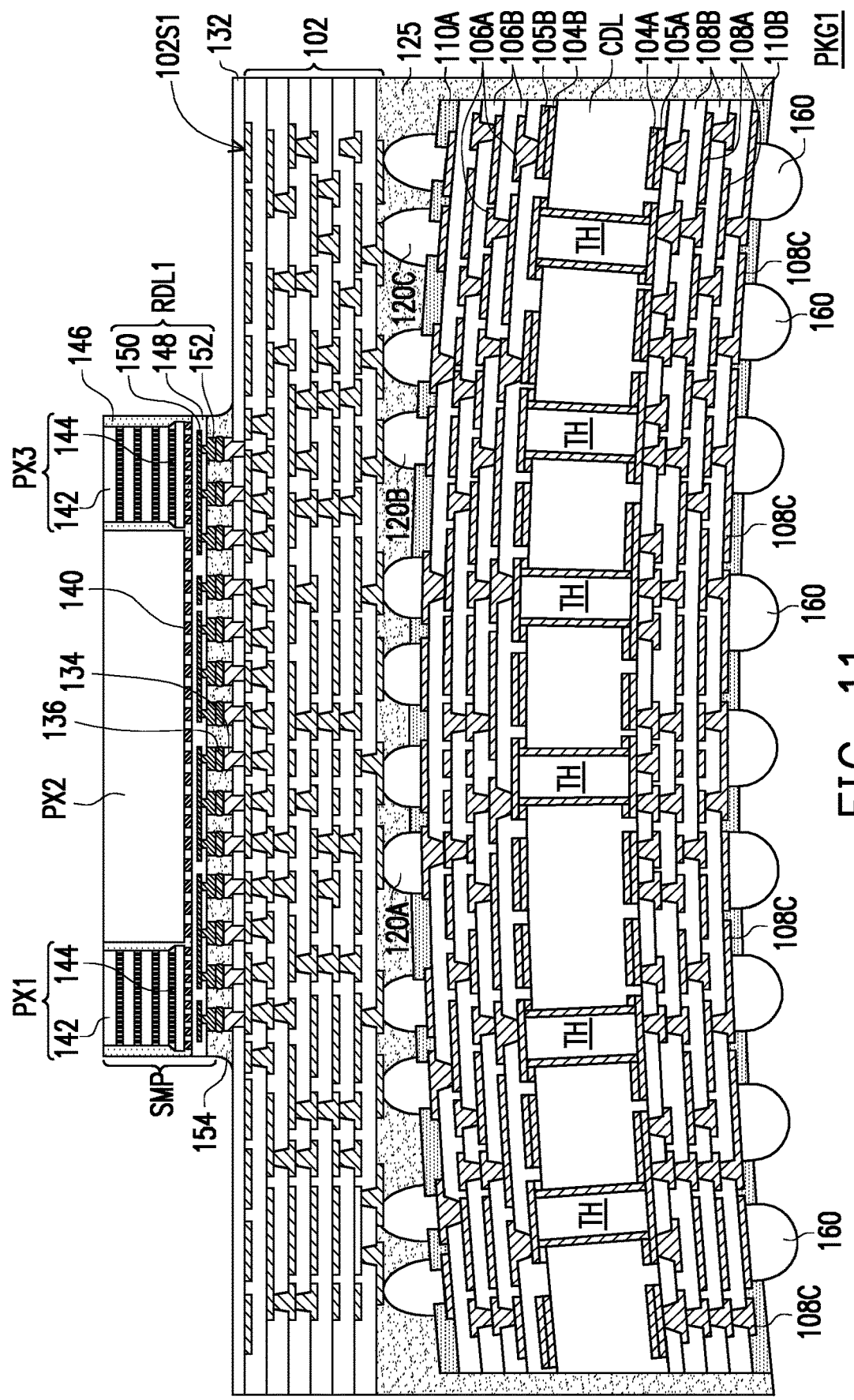

Referring to FIG. 10, in a subsequent step, the solder mask layer 110B on the second interconnection layer IN2 of the core substrate CBS is patterned to form a plurality of openings OPX. For example, the plurality of openings OPX reveal the bonding pads 108C of the second interconnection layer IN2. Referring to FIG. 11, after forming the openings OPX, a plurality of conductive terminals 160 is formed in the openings OPX to be electrically connected to the bonding pads 108C. In some embodiments, the conductive terminals 160 may be ball grid array (BGA) connectors, solder balls, metal pillars, and/or the like. In some embodiments, a pitch of the conductive terminals 160 may be in a range from 500 μm to 1500 μm. In some embodiments, the conductive terminals 160 may be formed by a mounting process and a reflow process. After forming the conductive terminals 160, a package structure PKG1 according to some embodiments of the present disclosure is accomplished.

FIG. 12A to FIG. 16 are schematic top and sectional views of various stages in a method of fabricating a package structure according to some other exemplary embodiments of the present disclosure. The method for fabricating a package structure illustrated in FIG. 12A to FIG. 16 is similar to the method for fabricating a package structure illustrated in FIG. 1 to FIG. 11. Therefore, the same reference numerals are used to refer to the same or liked parts, and its detailed description will be omitted herein.

Figure 12A:
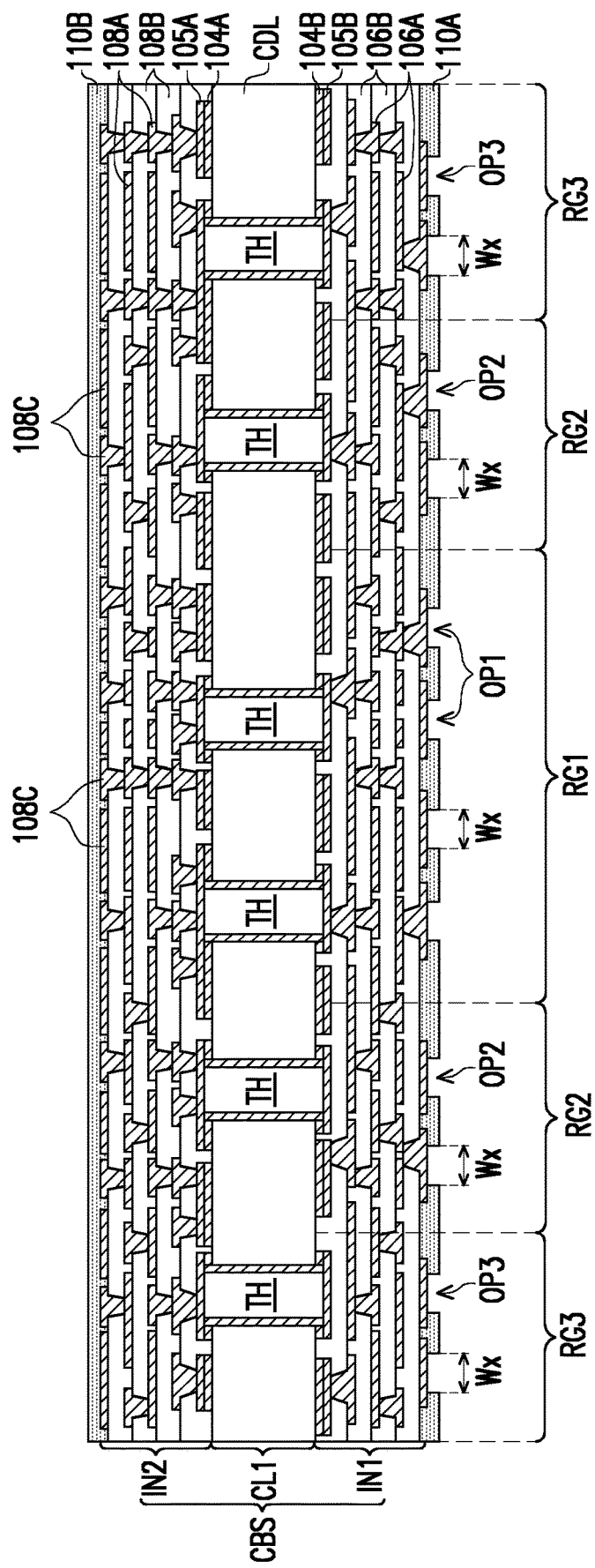
FIG. 12A to FIG. 16 are schematic top and sectional views of various stages in a method of fabricating a package structure according to some other exemplary embodiments of the present disclosure.
Figure 12B:
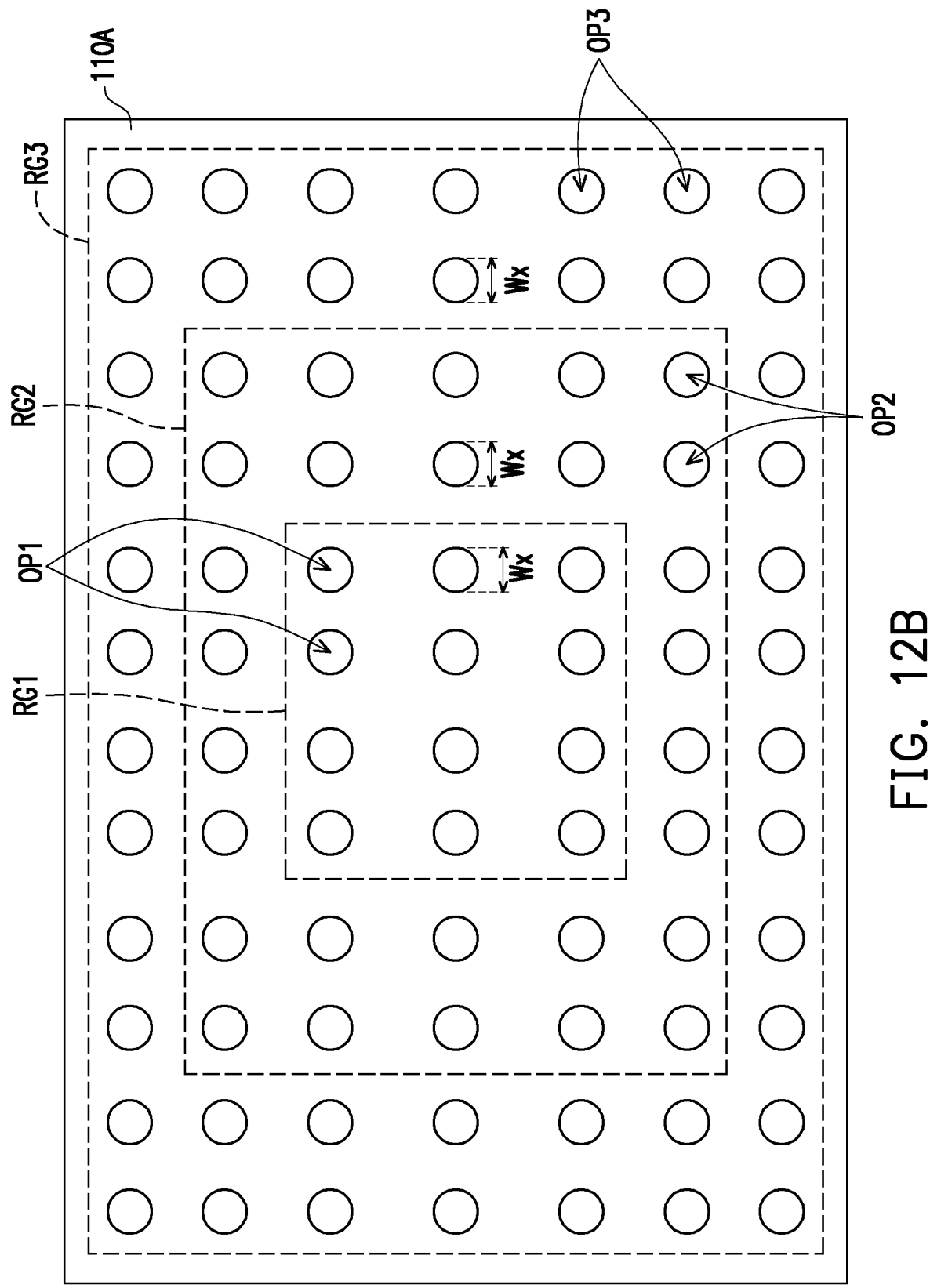

Referring to FIG. 12A, a core substrate CBS similar to that described in FIG. 2 is provided. In some embodiments, the solder mask layer 110A of the first interconnection layer IN1 is patterned to form a plurality of openings (OP1, OP2 and OP3) revealing the bonding pads 106C. For example, referring to FIG. 12B, which is a top view of the first interconnection layer IN1 shown in FIG. 12A, the solder mask layer 110A is patterned to from a plurality of first openings OP1 in the first region RG1, a plurality of second openings OP2 in the second region RG2, and a plurality of third openings OP3 in the third region RG3. In the exemplary embodiment, the first openings OP1, the second openings OP2 and the third openings OP3 have substantially equal widths Wx.

Figure 13:
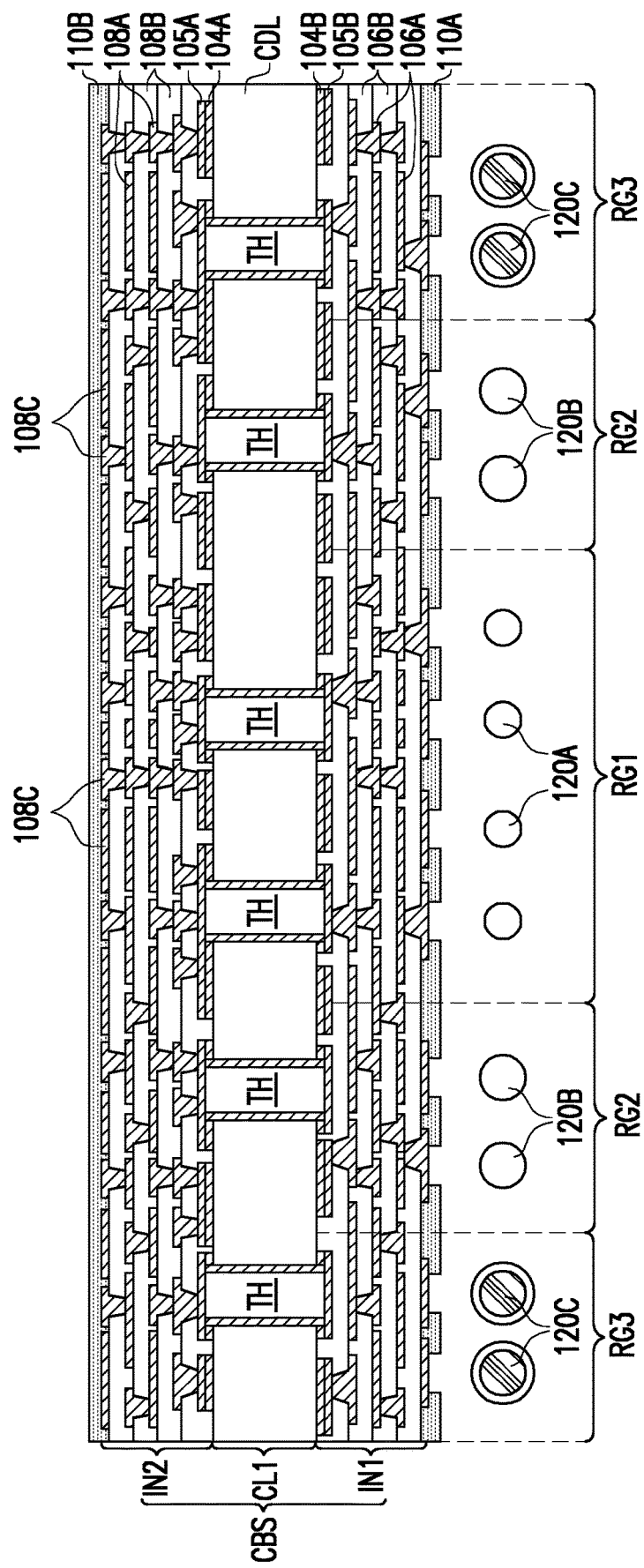

Referring to FIG. 13, after forming the openings (OP1, OP2, OP3) in the solder mask layer 110A, a plurality of first conductive terminals 120A, a plurality of second conductive terminals 120B and a plurality of third conductive terminals 120C are disposed over the openings (OP1, OP2, OP3) in the first region RG1, the second region RG2 and the third region RG3. In some embodiments, the first conductive terminals 120A and the second conductive terminals 120B are solder balls or solder bumps, and the third conductive terminals 120C are solder bumps having a conductive core. For example, the third conductive terminals 120C are solder bumps having a copper core. Prior to joining the conductive terminals (120A, 120B, 120C) to the bonding pads 106C, the third conductive terminals 120C in the third region RG3 have the greatest height, the second conductive terminals 120B in the second region RG2 have the medium height, while the first conductive terminals 120A in the first region RG1 have the smallest height.

Figure 14:
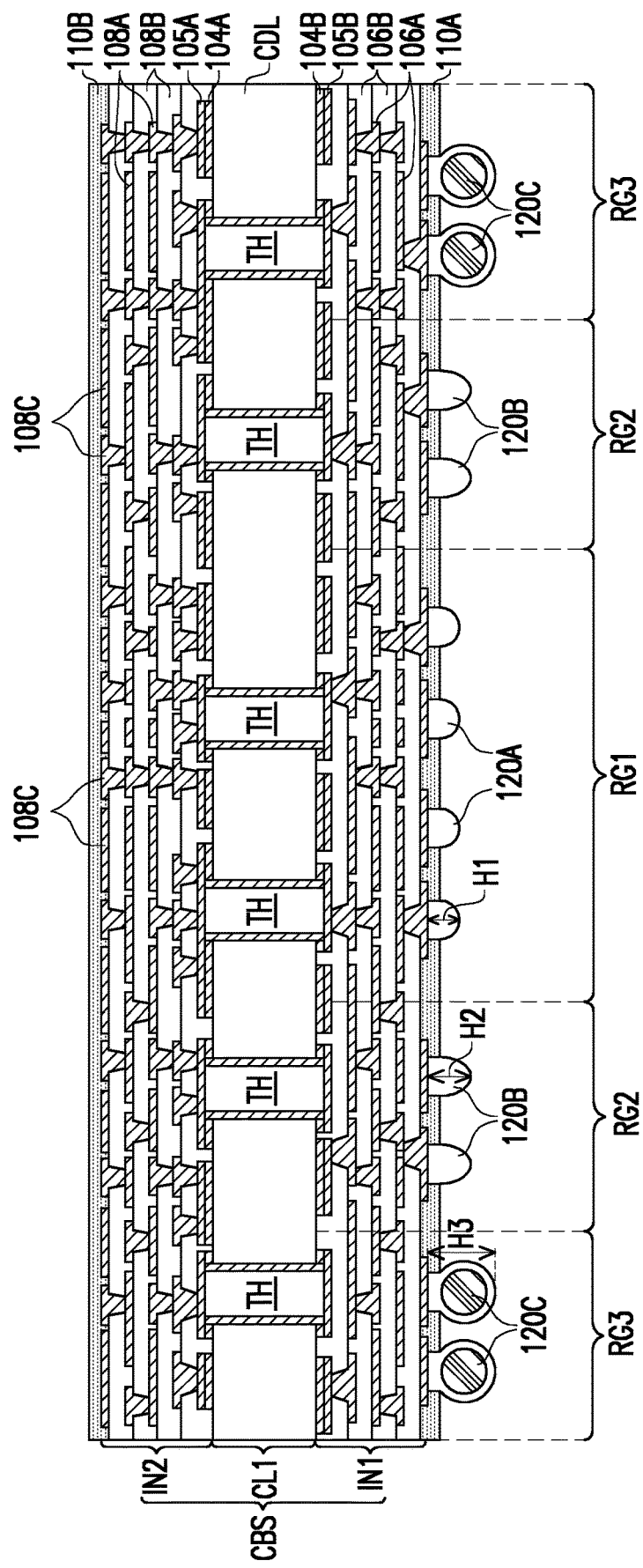

Referring to FIG. 14, in a subsequent step, the conductive terminals (120A, 120B, 120C) are attached onto the bonding pads 106C through a reflow process. In some embodiments, the height of the first conductive terminals 120A and the second conductive terminals 120B will be reduced after the reflow process. For example, due to partial melting (or solder collapse), the first conductive terminals 120A will have a first height H1, and the second conductive terminals 120B will have a second height H2 after the reflow process. For the third conductive terminals 120C, due to the presence of its conductive core, there will be minimal solder collapse, and the third conductive terminals 120C will maintain a third height H3, wherein H3>H2>H1. In the exemplary embodiment, a height of the conductive terminals (120A, 120B, 120C) may decrease from a boundary region (e.g.

third region RG3) of the first interconnection layer IN1 to a central region (e.g. the first region RG1) of the first interconnection layer IN1.

Figure 15:
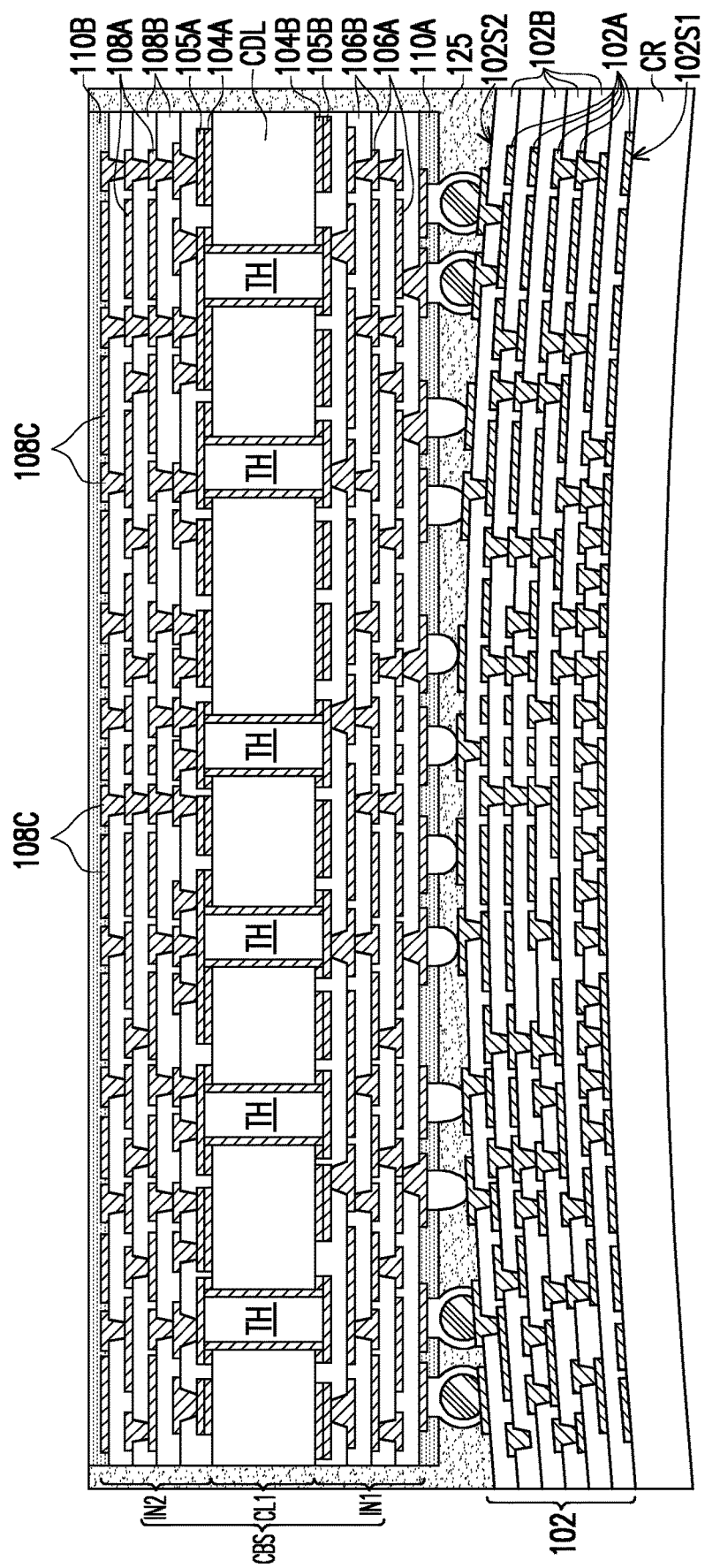

Referring to FIG. 15, after forming the conductive terminals (120A, 120B, 120C), the core substrate CBS illustrated in FIG. 14 is attached or bonded onto the redistribution structure 102 illustrated in FIG. 1. For example, the core substrate CBS is bonded and attached to the redistribution structure 102 through a reflow process. In the illustrated embodiment, the redistribution structure 102 has a cry warpage during bonding. Since the core substrate CBS bonded onto the redistribution structure 102 include conductive terminals (120A, 120B, 120C) with different heights, the warpage problem of the redistribution structure 102 may be compensated, and the joint reliability and process yield between the substrate (core substrate CBS) and the wafer (redistribution structure 102) may be effectively improved. After bonding the core substrate CBS to the redistribution structure 102, an insulating encapsulant 125 is formed on the redistribution structure 102 to encapsulate the core substrate CBS.

Figure 16:
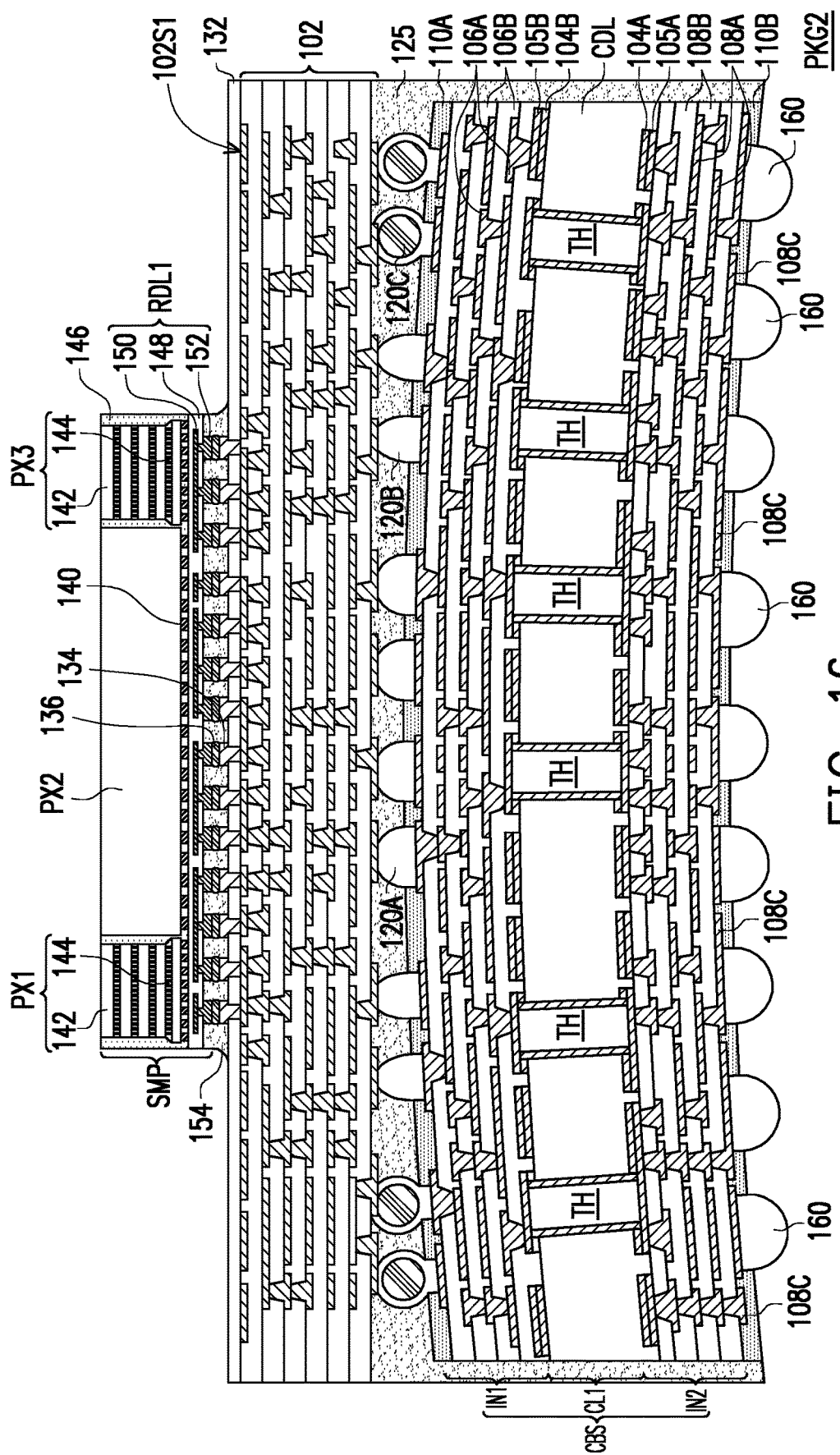

Referring to FIG. 16, the same steps described in FIG. 8 to FIG. 11 may then be performed to de-bond the carrier CR, to bond the semiconductor package SMP onto the redistribution structure 102 through the electrical connectors 136, and to form conductive terminals 160 on the second interconnection layer IN2 of the core substrate CBS. Up to here, a package structure PKG2 according to some other embodiments of the present disclosure is accomplished.

FIG. 17 to FIG. 21 are schematic sectional views of various stages in a method of fabricating a package structure according to some other exemplary embodiments of the present disclosure. The method for fabricating a package structure illustrated in FIG. 17 to FIG. 21 is similar to the method for fabricating a package structure illustrated in FIG. 1 to FIG. 11. Therefore, the same reference numerals are used to refer to the same or liked parts, and its detailed description will be omitted herein.

Figure 17:
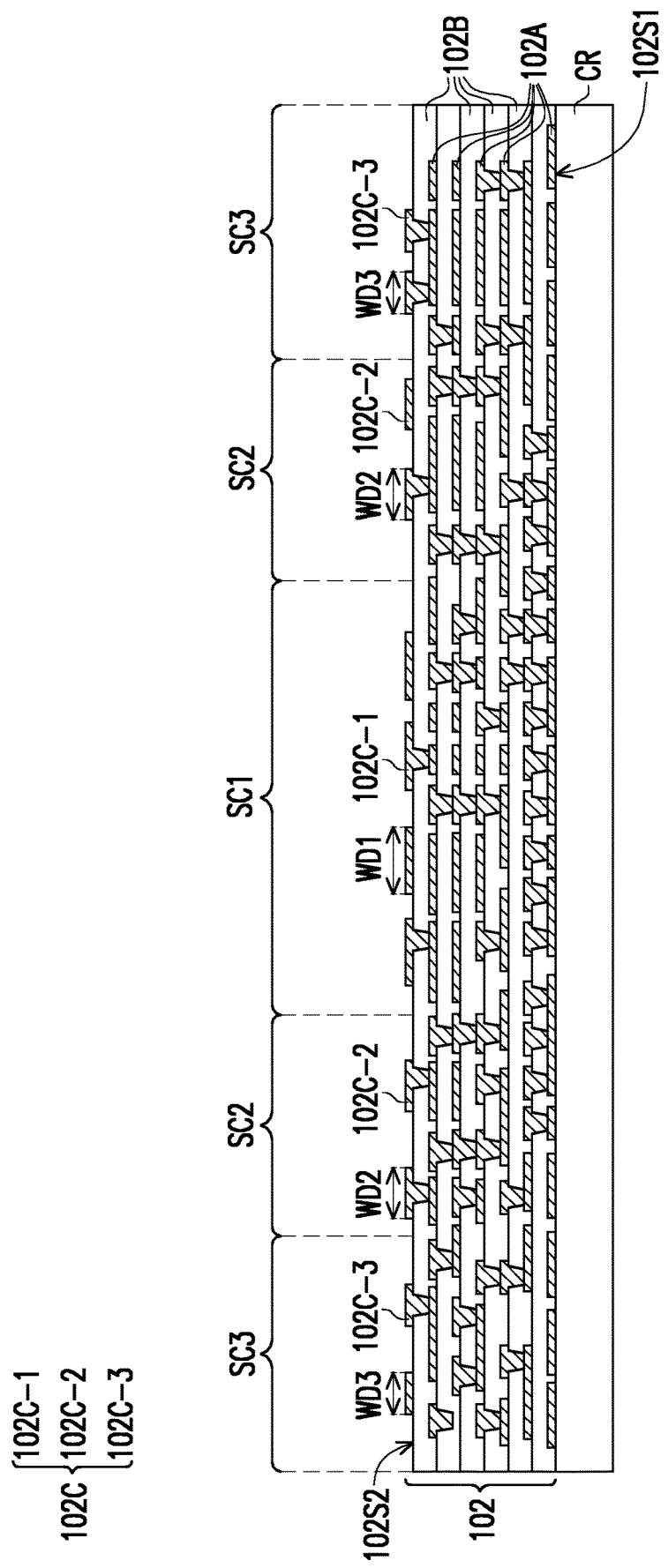
FIG. 17 to FIG. 21 are schematic sectional views of various stages in a method of fabricating a package structure according to some other exemplary embodiments of the present disclosure.

Referring to FIG. 17, a redistribution structure 102 similar to that described in FIG. 1 is provided. The difference between the embodiments is that the connection pads 102C located in the first section SC1, the second section SC2 and the third section SC3 of the redistribution structure 102 have different widths as illustrated in FIG. 17. For example, in the exemplary embodiment, the connection pads 102C include first connection pads 102C-1, second connection pads 102C-2 and third connection pads 102C-3. The first connection pads 102C-1 are located in the first section SC1 of the redistribution structure 102 and have a first width WD1. The second connection pads 102C-2 are located in the second section SC2 of the redistribution structure 102 and have a second width WD2. The third connection pads 102C-3 are located in the third section SC3 of the redistribution structure 102 and have a third width WD3, wherein WD1>WD2>WD3. In other words, a width of the connection pads (102C-3, 102C-2, 102C-1) increases from a boundary region (third section SC3) of the redistribution structure 102 to a central region (first section SC1) of the redistribution structure 102.

Figure 18:
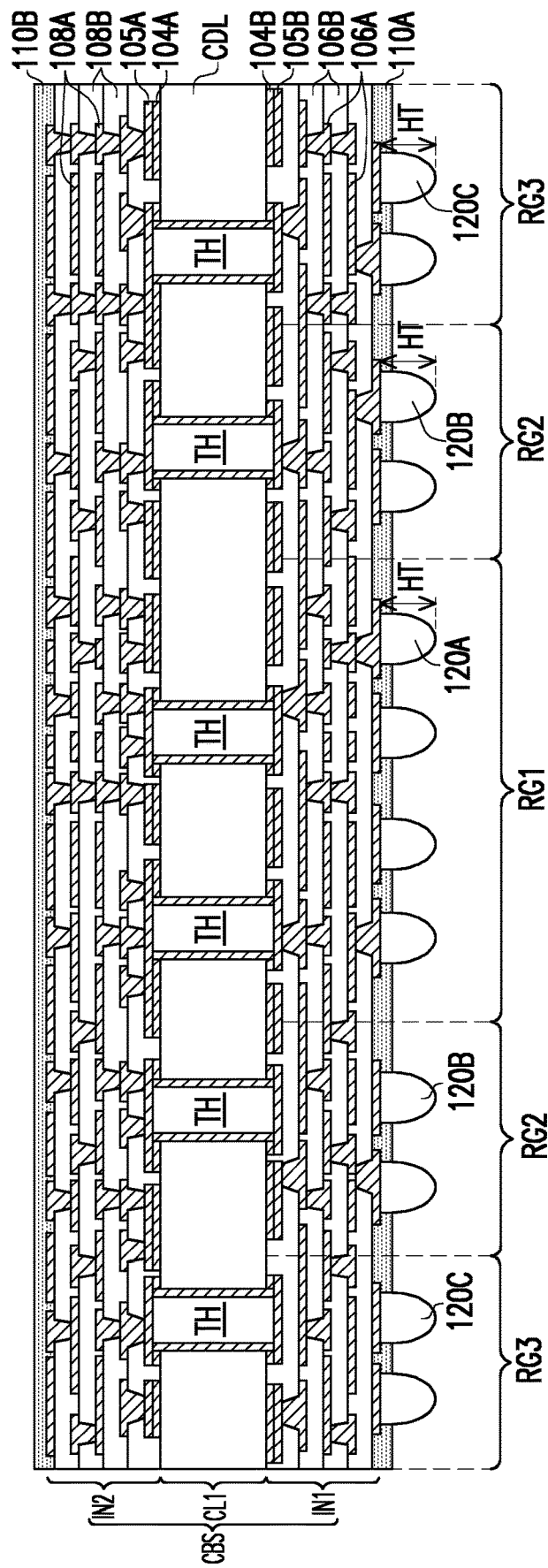

Referring to FIG. 18, a core substrate CBS similar to that described in FIG. 13 is provided. The difference between the embodiments is that the first conductive terminals 120A, the second conductive terminals 120B and the third conductive terminals 120C illustrated in FIG. 18 have substantially equal heights HT after being attached to the bonding pads 106C.

Figure 19:
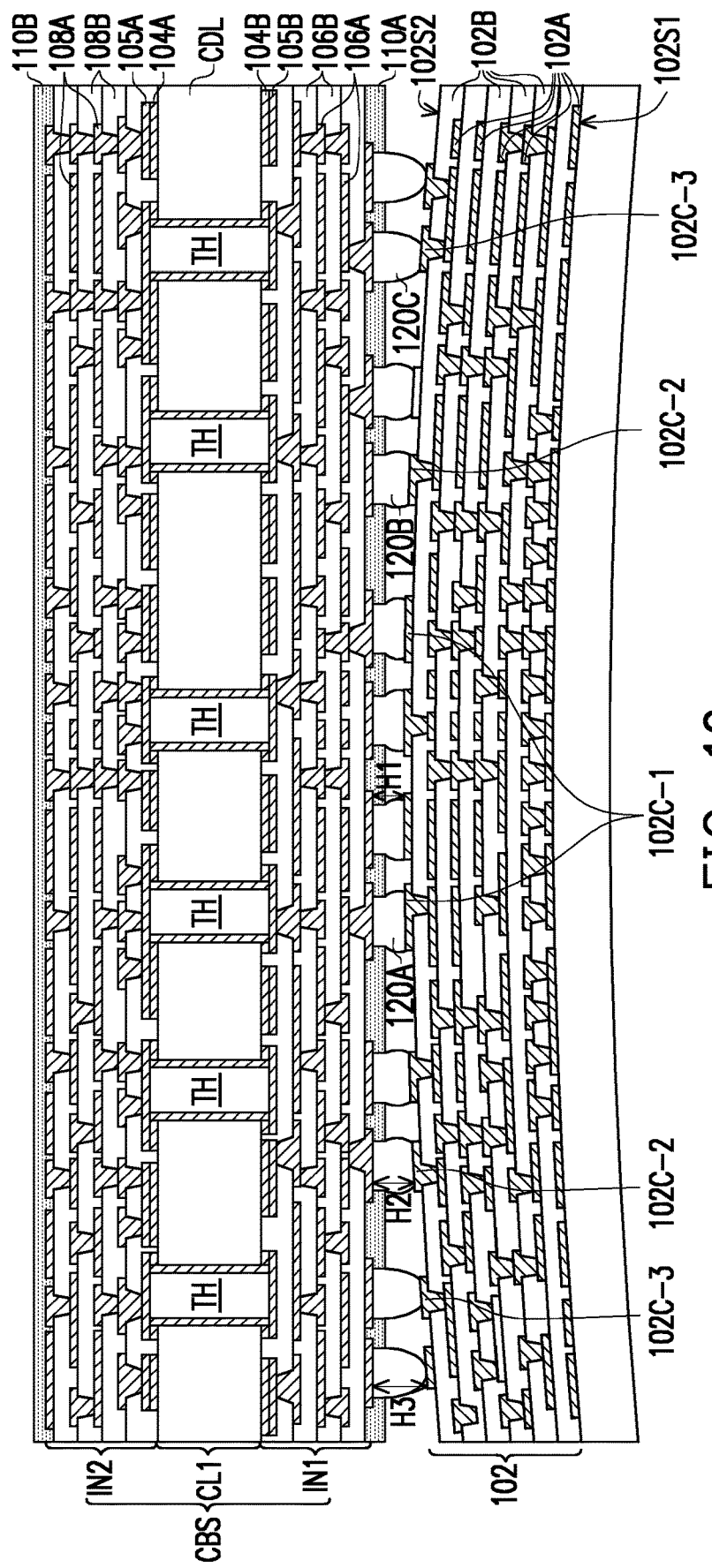

Referring to FIG. 19, in a subsequent step, the core substrate CBS illustrated in FIG. 18 is attached or bonded onto the redistribution structure 102 illustrated in FIG. 17. For example, the core substrate CBS is bonded and attached to the redistribution structure 102 through a reflow process. In the illustrated embodiment, due to the solder wetting of the conductive terminals (120A, 120B and 120C) during their bonding to connection pads (102C-3, 102C-2, 102C-1) with different widths, the conductive terminals (120A, 120B and 120C) will have different heights after the bonding process. For example, the first conductive terminals 120A bonded to the first connection pads 102C-1 having the greatest width (WD1) will have a first height H1, which is the smallest height due to a greater adhering surface and more solder spreading on the first connection pads 102C-1. The second conductive terminals 120B bonded to the second connection pads 102C-2 having the medium width (WD2) will have a second height H2, which is the medium height due to a medium adhering surface on the second connection pads 102C-2. The third conducive terminals 120C bonded to the third connection pads 102C-3 having the smallest width (WD3) will have a third height H3, which is the greatest height due to the smallest adhering surface and less solder spreading on the third connection pads 102C-3.

Figure 20:
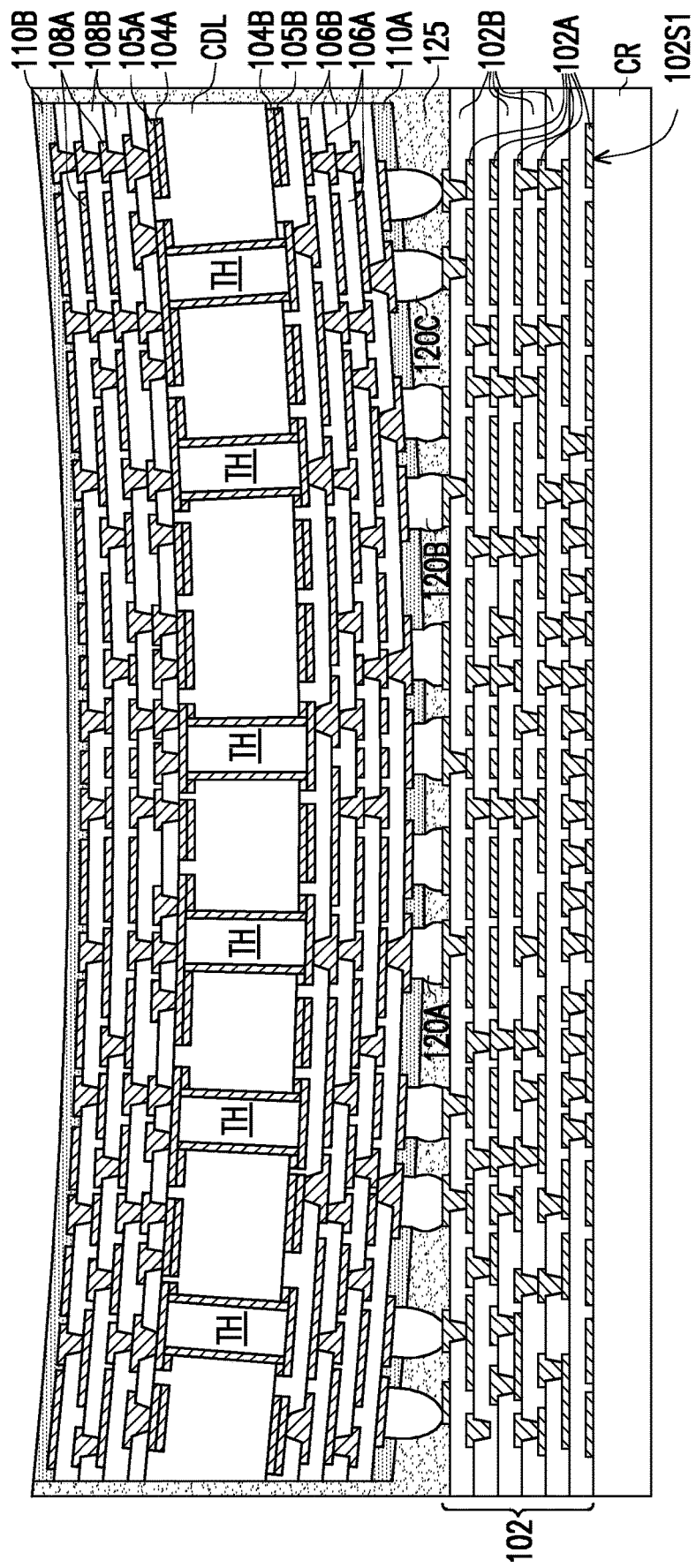
Figure 21:
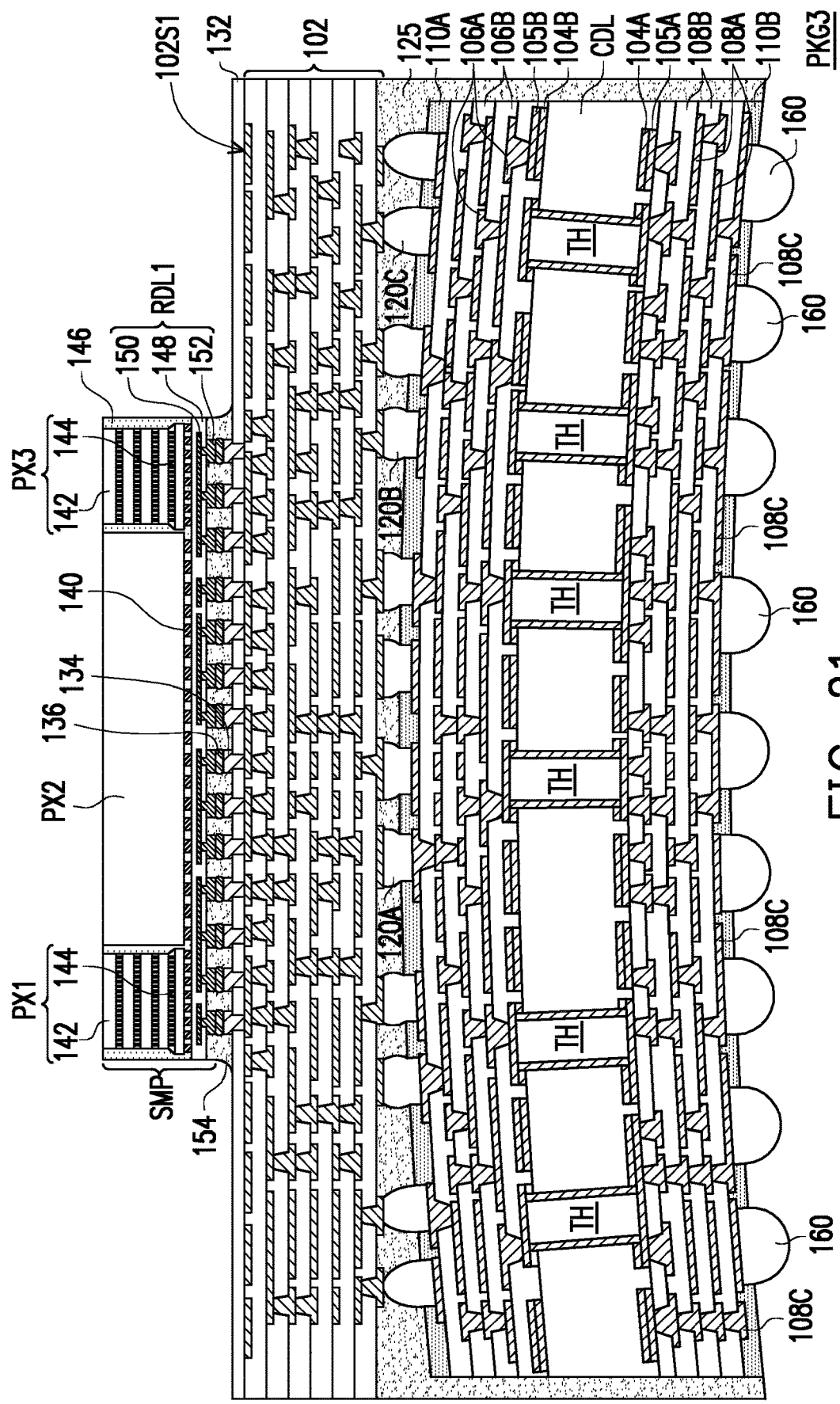

Referring to FIG. 20, after bonding the core substrate CBS to the redistribution structure 102, an insulating encapsulant 125 is formed on the redistribution structure 102 to encapsulate the core substrate CBS. Subsequently, referring to FIG. 21, the same steps described in FIG. 8 to FIG. 11 may then be performed to de-bond the carrier CR, to bond the semiconductor package SMP onto the redistribution structure 102 through the electrical connectors 136, and to form conductive terminals 160 on the second interconnection layer IN2 of the core substrate CBS. Up to here, a package structure PKG3 according to some other embodiments of the present disclosure is accomplished. In the package structure PKG3, since the core substrate CBS bonded onto the redistribution structure 102 include conductive terminals (120A, 120B, 120C) with different heights, the warpage problem of the redistribution structure 102 and/or the core substrate CBS may be compensated, and the joint reliability and process yield between the substrate (core substrate CBS) and the wafer (redistribution structure 102) may be effectively improved.

Figure 22:
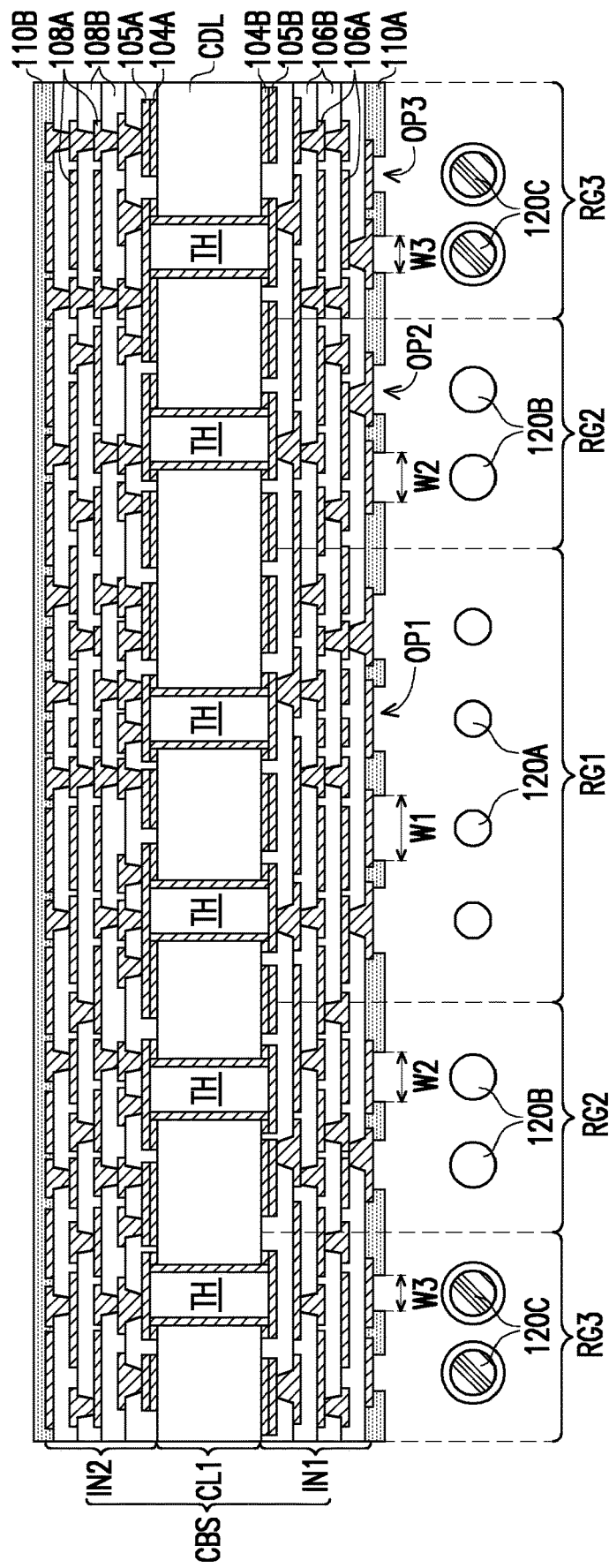
FIG. 22 to FIG. 24 are schematic sectional views of various stages in a method of fabricating a package structure according to some other exemplary embodiments of the present disclosure.
Figure 23:
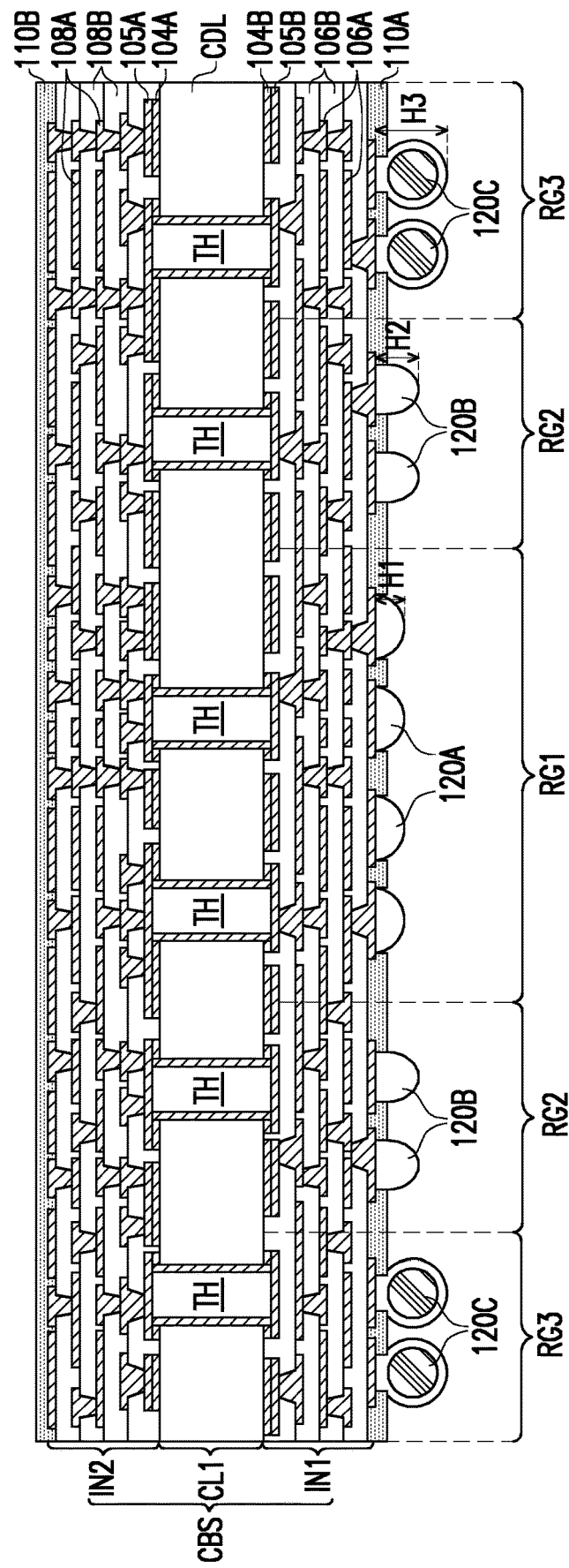
Figure 24:
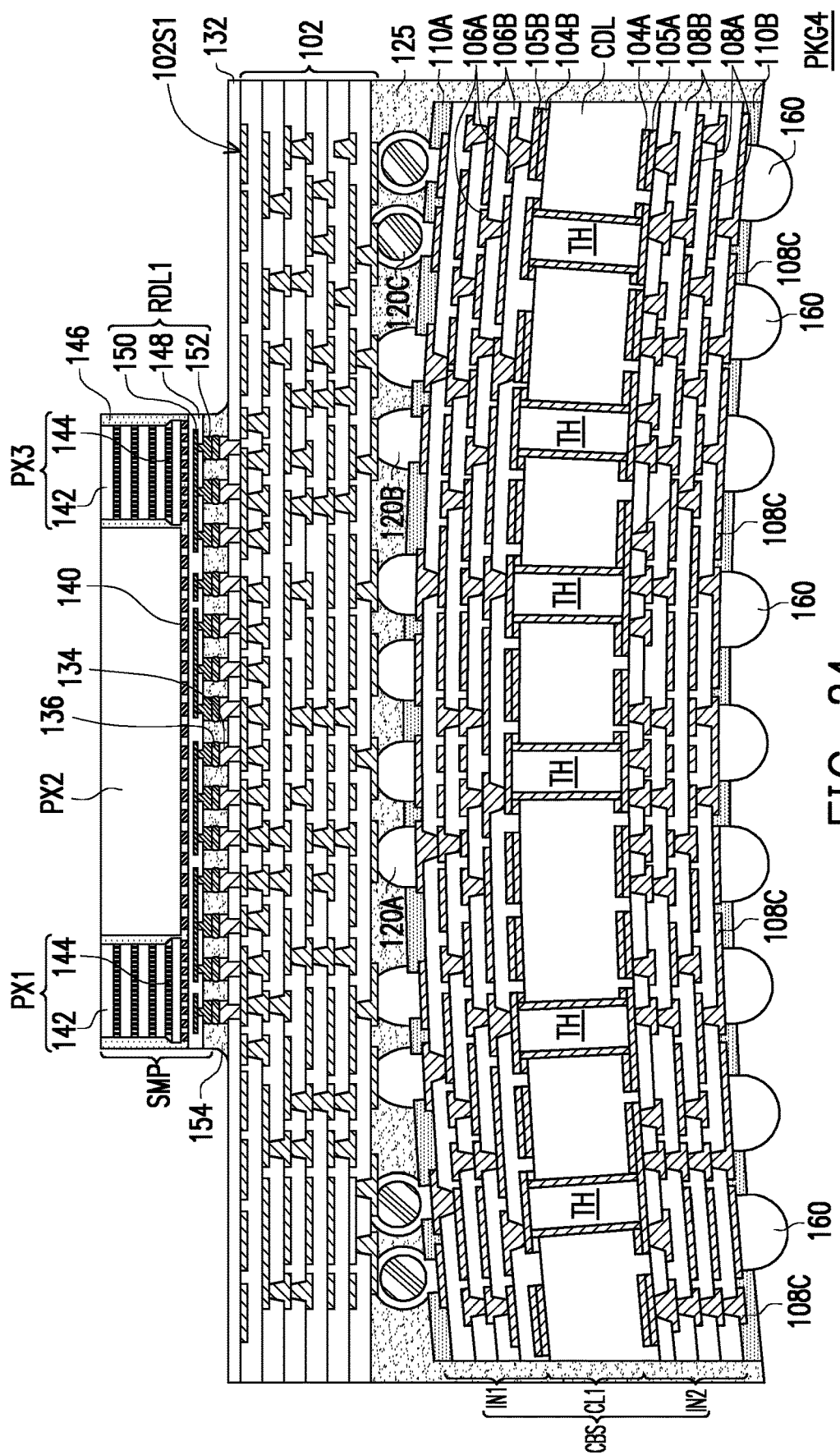

FIG. 22 to FIG. 24 are schematic sectional views of various stages in a method of fabricating a package structure according to some other exemplary embodiments of the present disclosure. The method for fabricating a package structure illustrated in FIG. 22 to FIG. 24 is similar to the method for fabricating a package structure illustrated in FIG. 1 to FIG. 11. Therefore, the same reference numerals are used to refer to the same or liked parts, and its detailed description will be omitted herein.

Referring to FIG. 22, a redistribution structure 102 similar to that described in FIG. 3A is provided. In other words, the solder mask layer 110A is patterned to from a plurality of first openings OP1 in the first region RG1, a plurality of second openings OP2 in the second region RG2, and a plurality of third openings OP3 in the third region RG3. The first openings OP1 has a first width W1, and the first openings OP1 are revealing the bonding pads 106C in the first region RG1. The second openings OP2 has a second width W2, and the second openings OP2 are revealing the bonding pads 106C in the second region RG2. The third openings OP3 has a third width W3, and the third openings OP3 are revealing the bonding pads 106C in the third region RG3, whereby W1>W2>W3.

In some embodiments, after forming the openings (OP1, OP2, OP3) in the solder mask layer 110A, a plurality of first conductive terminals 120A, a plurality of second conductive terminals 120B and a plurality of third conductive terminals 120C are disposed over the openings (OP1, OP2, OP3) in the first region RG1, the second region RG2 and the third region RG3. For example, the first conductive terminals 120A and the second conductive terminals 120B are solder balls or solder bumps, and the third conductive terminals 120C are solder bumps having a conductive core. Prior to joining the conductive terminals (120A, 120B, 120C) to the bonding pads 106C, the third conductive terminals 120C in the third region RG3 have the greatest height, the second conductive terminals 120B in the second region RG2 have the medium height, while the first conductive terminals 120A in the first region RG1 have the smallest height.

Referring to FIG. 23, in a subsequent step, the conductive terminals (120A, 120B, 120C) are attached onto the bonding pads 106C through a reflow process. In some embodiments, the height of the first conductive terminals 120A and the second conductive terminals 120B will be reduced after the reflow process. For example, due to partial melting (or solder collapse/deformation) of the conductive terminals 120, and the spreading of the materials in the openings (OP1, OP2, OP3) with different widths (W1, W2, W3), the height difference between the conductive terminals (120A, 120B, 120C) will become more apparent. In some embodiments, first conductive terminals 120A are formed in the first openings OP1 over the bonding pads 106C in the first region RG1, and have a first height H1. Second conductive terminals 120B are formed in the second openings OP2 over the bonding pads 106C in the second region RG2, and have a second height H2. Third conductive terminals 120C are formed in the third opening OP3 over the bonding pads 106C in the third region RG3, and a have a third height H3. Furthermore, due to the presence of the conductive core in the third conductive terminals, there will be minimal solder collapse, and the third conductive terminals 120C will maintain the greatest height, whereby H3>H2>H1.

Referring to FIG. 24, the same steps described in FIG. 6A to FIG. 11 may then be performed to bond the core substrate CBS on the redistribution structure 102, to de-bond the carrier CR, to bond the semiconductor package SMP onto the redistribution structure 102 through the electrical connectors 136, and to form conductive terminals 160 on the second interconnection layer IN2 of the core substrate CBS. Up to here, a package structure PKG4 according to some other embodiments of the present disclosure is accomplished. In the package structure PKG4, since the core substrate CBS bonded onto the redistribution structure 102 include conductive terminals (120A, 120B, 120C) with different heights, the warpage problem of the redistribution structure 102 and/or the core substrate CBS may be compensated, and the joint reliability and process yield between the substrate (core substrate CBS) and the wafer (redistribution structure 102) may be effectively improved.

Figure 25B:
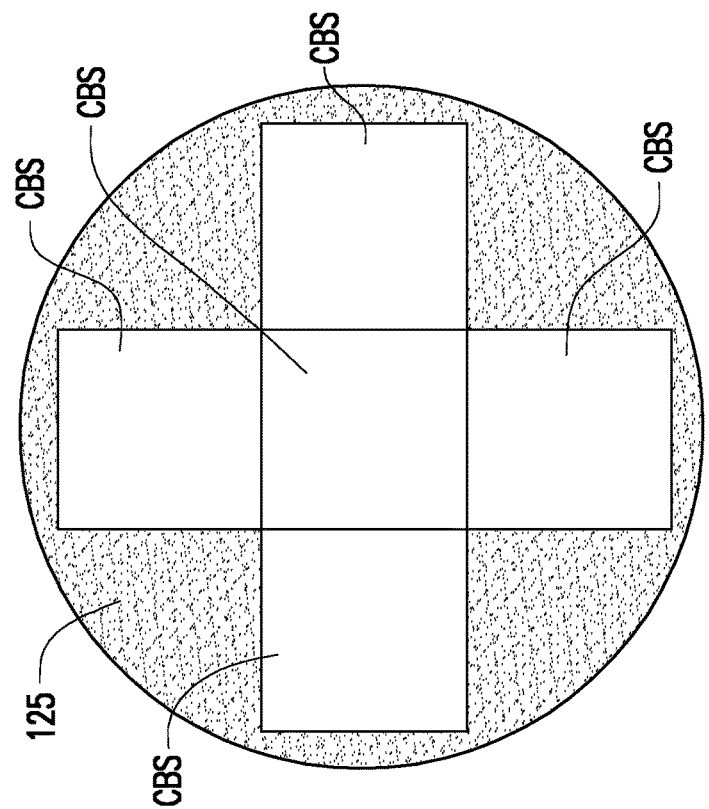
FIG. 25A and FIG. 25B are schematic top views of various stages in a method of fabricating a system-on-integrated-substrate (SoIS) package according to some exemplary embodiments of the present disclosure.
Figure 25A:
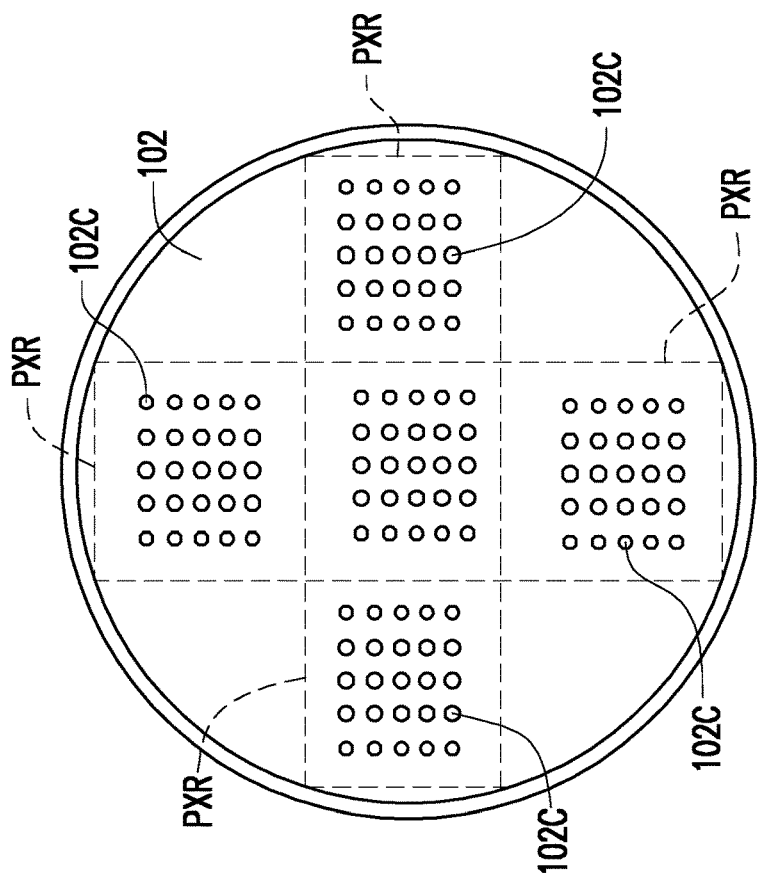

FIG. 25A and FIG. 25B are schematic top views of various stages in a method of fabricating a system-on-integrated-substrate (SoIS) package according to some exemplary embodiments of the present disclosure. Referring to FIG. 25A, in some embodiments, the redistribution structure 102 described in the package structures PKG1, PKG2, PKG3 and PKG4 are parts of a wafer in an SoIS package. For example, the wafer includes a plurality of package regions PXR where the connection pads 102C of the redistribution structure 102 are exposed. Referring to FIG. 25B, in some embodiments, the core substrates CBS described in the package structures PKG1, PKG2, PKG3 and PKG4 may be bonded to the redistribution structure 102 in each of the package regions PXR using the methods described above. As illustrated in FIG. 25B, five core substrates CBS are bonded onto the redistribution structure 102, and an insulating encapsulant 125 is formed on the redistribution structure 102 to encapsulate the five core substrates CBS. As such, an SoIS package in accordance with some embodiments of the present disclosure is accomplished.

In the above-mentioned embodiments, the package structure includes a core substrate disposed on a redistribution structure, whereby conductive terminals are used for electrically connecting the bonding pads of the core substrate to the connection pads of the redistribution structure. Since the core substrate bonded onto the redistribution structure include conductive terminals with different heights, the warpage problem of the redistribution structure and/or the core substrate may be compensated, and the joint reliability and process yield between the substrate (core substrate) and the wafer (redistribution structure) may be effectively improved.

In accordance with some embodiments of the present disclosure, a package structure includes a redistribution structure and a core substrate. The redistribution structure includes a plurality of connection pads. The core substrate is disposed on the redistribution structure and electrically connected to the plurality of connection pads. The core substrate includes a first interconnection layer and a plurality of conductive terminals. The first interconnection layer has a first region, a second region surrounding the first region, and a third region surrounding the second region, and includes a plurality of bonding pads located in the first region, the second region and the third region. The conductive terminals are electrically connecting the plurality of bonding pads to the plurality of connection pads of the redistribution structure, wherein the plurality of conductive terminals located over the first region, the second region and the third region of the first interconnection layer have different heights.

In accordance with some other embodiments of the present disclosure, a package structure includes a redistribution structure, a semiconductor package and a core substrate. The redistribution structure has a first surface and a second surface opposite to the first surface. The semiconductor package is disposed on the first surface and electrically connected to the redistribution structure. The core substrate is disposed on the second surface and electrically connected to the redistribution structure. The core substrate includes a core layer, a first interconnection layer, a second interconnection layer and a plurality of conductive terminals. The first interconnection layer and the second interconnection layer are disposed on two opposing surfaces of the core layer. The conductive terminals are disposed on the first interconnection layer and sandwiched between the second surface of the redistribution structure and the first interconnection layer, wherein a height of the plurality of conductive terminals decreases from a boundary region of the first interconnection layer to a central region of the first interconnection layer.

In accordance with yet another embodiment of the present disclosure, a method of fabricating a package structure is described. The method includes the following steps. A redistribution structure including a plurality of connection pads is provided. A core substrate is formed by forming a first interconnection layer and attaching a plurality of conductive terminals on the first interconnection layer. The first interconnection layer is formed over a core layer, wherein the first interconnection layer has a first region, a second region surrounding the first region, and a third region surrounding the second region, and wherein a plurality of bonding pads is formed in the first region, the second region and the third region of the first interconnection layer. The plurality of conductive terminals is attached on the plurality of bonding pads over the first region, the second region and the third region of the first interconnection layer. The core substrate is bonded onto the redistribution structure by electrically connecting the plurality of conductive terminals to the plurality connection pads, wherein after bonding the core substrate, the plurality of conductive terminals located over the first region, the second region and the third region of the first interconnection layer have different heights.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a redistribution structure having a first surface and a second surface opposite to the first surface;
    a semiconductor package disposed on the first surface and electrically connected to the redistribution structure;
    a plurality of core substrates disposed on the second surface and electrically connected to the redistribution structure, wherein the plurality of core substrates partially covers the second surface of the redistribution structure, and each of the plurality of core substrates comprises:
        a core layer;
        a first interconnection layer and a second interconnection layer disposed on two opposing surfaces of the core layer; and
        a plurality of conductive terminals disposed on the first interconnection layer and sandwiched between the second surface of the redistribution structure and the first interconnection layer, wherein a height of the plurality of conductive terminals decreases from a boundary region of the first interconnection layer to a central region of the first interconnection layer; and
    an insulating encapsulant encapsulating the plurality of core substrates, wherein sidewalls of the insulating encapsulant are aligned with sidewalls of the redistribution structure, and the insulating encapsulant covers and surround the plurality of conductive terminals with decreasing height.

2. The package structure according to claim 1, wherein the plurality of conductive terminals located on the boundary region of the first interconnection layer are solder bumps having a conductive core.

3. The package structure according to claim 1, wherein the first interconnection layer comprises:
    a plurality of bonding pads located along the boundary region and the central region of the first interconnection layer; and
    a solder mask layer partially covering the plurality of bonding pads, wherein the solder mask layer comprises a plurality of openings revealing the plurality of bonding pads.

4. The package structure according to claim 3, wherein a width of the plurality of openings of the solder mask layer increases from the boundary region to the central region of the first interconnection layer.

5. The package structure according to claim 1, wherein the redistribution structure comprises a plurality of connection pads exposed at the second surface, and a width of the plurality of connection pads increases from a boundary region of the redistribution structure to a central region of the redistribution structure.

6. The package structure according to claim 1, wherein the redistribution structure comprises a plurality of connection pads exposed at the first surface, wherein the semiconductor package is electrically connected to the plurality of connections pads through a plurality of electrical connectors.

7. The package structure according to claim 6, further comprising an underfill structure located in between the semiconductor package and the redistribution structure, and covering the plurality of electrical connectors.

8. The package structure according to claim 1, wherein the plurality of core substrates includes five core substrates disposed on and electrically connected to the redistribution structure.

9. A method of fabricating a package structure, comprising:
    providing a semiconductor wafer having a redistribution structure, wherein the redistribution structure comprising a plurality of connection pads located on package regions of the semiconductor wafer;
    forming a plurality of core substrates, wherein each of the plurality of core substrates are formed by the steps comprising:
        forming a first interconnection layer over a core layer, wherein the first interconnection layer has a first region, a second region surrounding the first region, and a third region surrounding the second region, and wherein a plurality of bonding pads is formed in the first region, the second region and the third region of the first interconnection layer; and
        attaching a plurality of conductive terminals on the plurality of bonding pads over the first region, the second region and the third region of the first interconnection layer;
    bonding the plurality of core substrates onto the redistribution structure in the package regions of the semiconductor wafer by electrically connecting the plurality of conductive terminals to the plurality connection pads, wherein after bonding the core substrate, the plurality of conductive terminals located over the first region, the second region and the third region of the first interconnection layer have different heights; and forming an insulating encapsulant on the redistribution structure encapsulating the plurality of core substrates and encapsulating the plurality of conductive terminals with different heights.

10. The method according to claim 9, wherein forming the first interconnection layer further comprises:
   forming a solder mask layer covering the plurality of bonding pads, and patterning the solder mask layer to form a plurality of first openings, a plurality of second openings and a plurality of third openings, wherein
   the plurality of first openings have a first width W1 and is revealing the plurality of bonding pads located in the first region;
   the plurality of second openings have a second width W2 and is revealing the plurality of bonding pads located in the second region; and
   the plurality of third openings have a third width W3 and is revealing the plurality of bonding pads located in the third region, wherein W1>W2>W3, and the plurality of conductive terminals are disposed within the plurality of first openings, the plurality of second openings and the plurality of third openings to be electrically connected to the plurality of bonding pads.

11. The method according to claim 9, wherein attaching the plurality of conductive terminals on the plurality of bonding pads comprises:
   attaching a plurality of first conductive terminals on the plurality of bonding pads in the first region, wherein the plurality of first conductive terminals has a first height H1;
   attaching a plurality of second conductive terminals on the plurality of bonding pads in the second region, wherein the plurality of second conductive terminals has a second height H2;
   attaching a plurality of third conductive terminals on the plurality of bonding pads in the third region, wherein the plurality of third conductive terminals has a third height H3, wherein H3>H2>H1.

12. The method according to claim 11, wherein the plurality of first conductive terminals and the plurality of second conductive terminals are solder bumps, and the plurality of third conductive terminals are solder bumps having a conductive core.

13. The method according to claim 9, wherein the plurality of conductive terminals is attached onto the plurality of bonding pads through a reflow process, and prior to performing the reflow process, the plurality of conductive terminals located over the first region, the second region and the third region have the same height.

14. A method of fabricating a package structure, comprising:
   providing at least one core substrate having a first surface and a second surface;
   attaching a plurality of conductive terminals on the first surface of the at least one core substrate, wherein the plurality of conductive terminals has substantially equal heights;
   providing a redistribution structure, wherein the redistribution structure comprises a first section, a second section surrounding the first section, and a third section surrounding the second section, and a plurality of connection pads located in the first section, the second section and the third section and having different widths;
   bonding the at least one core substrate to the redistribution structure by joining the plurality of conductive terminals to the plurality of connection pads having different widths, wherein after bonding the at least one core substrate to the redistribution structure, the heights of the plurality of conductive terminals is changed so that the plurality of conductive terminals located over the first section of the redistribution structure has the smallest height and greatest width out of all the plurality of conductive terminals, while the plurality of conductive terminals located over the third section of the redistribution structure has the greatest height and smallest width out of all the plurality of conductive terminals,
   wherein providing the at least one core substrate comprises providing five core substrates, and the five core substrates are bonded to the redistribution structure by joining the plurality of conductive terminals to the plurality of connection pads having different widths.

15. The method according to claim 14, wherein after attaching the plurality of conductive terminals to the first surface of the core substrate, the plurality of conductive terminals is bonded to the plurality of connection pads of the redistribution structure through a reflow process to change the heights of the plurality of conductive terminals.

16. The method according to claim 14, further comprising bonding a semiconductor package on the redistribution structure, and forming a plurality of second conductive terminals on the second surface of the core substrate.

17. The method according to claim 16, wherein the semiconductor package is bonded to the redistribution structure through a plurality of electrical connectors, and the method further comprises forming an underfill structure between the semiconductor package and the redistribution structure to cover the plurality of electrical connectors.

18. The method according to claim 14, wherein after bonding the five core substrates to the redistribution structure, the method further comprises forming an insulating encapsulant on the redistribution structure to encapsulate the five core substrates.

19. The method according to claim 14, wherein attaching the plurality of conductive terminals on the five core substrates comprises:
   patterning a solder mask layer of the five core substrates to form a plurality of openings having substantially equal widths; and
   forming the plurality of conductive terminals in the plurality of openings, wherein the solder mask layer is partially covering and contacting the plurality of conductive terminals.

20. The method according to claim 14, wherein the redistribution structure has a circular shape, and the five core substrates have a square shape from a top view of the package structure.

* * * * *